United States Patent
Pichai et al.

(10) Patent No.: US 12,004,329 B1
(45) Date of Patent: *Jun. 4, 2024

(54) DATA CENTER REFRIGERATION SYSTEM

(71) Applicant: Equinix, Inc., Redwood City, CA (US)

(72) Inventors: Tikhon Suresh Pichai, Simpsonville, SC (US); Douglas James Asay, San Jose, CA (US); Bhavin Raju Shah, Sunnyvale, CA (US)

(73) Assignee: EQUINIX, INC., Redwood City, CA (US)

( * ) Notice: Subject to any disclaimer, the term of this patent is extended or adjusted under 35 U.S.C. 154(b) by 766 days.

This patent is subject to a terminal disclaimer.

(21) Appl. No.: 17/141,074

(22) Filed: Jan. 4, 2021

Related U.S. Application Data

(63) Continuation-in-part of application No. 16/115,199, filed on Aug. 28, 2018, now Pat. No. 10,888,024.

(60) Provisional application No. 62/551,064, filed on Aug. 28, 2017.

(51) Int. Cl.
H05K 7/20 (2006.01)

(52) U.S. Cl.
CPC ..... *H05K 7/20818* (2013.01); *H05K 7/20836* (2013.01)

(58) Field of Classification Search
CPC ............ H05K 7/20836; H05K 7/20818
See application file for complete search history.

(56) References Cited

U.S. PATENT DOCUMENTS

| | | | |
|---|---|---|---|
| 4,483,154 A | 11/1984 | Smeal | |
| 6,017,200 A * | 1/2000 | Childs | B01D 61/12 417/404 |
| 6,270,681 B1 | 8/2001 | Gray | |
| 6,466,442 B2 | 10/2002 | Lin | |
| 6,508,301 B2 | 1/2003 | Marsala | |
| 8,196,667 B2 * | 6/2012 | Ocalan | F04B 47/06 166/372 |
| 8,360,750 B2 * | 1/2013 | Ferk | F04B 43/067 417/404 |

(Continued)

OTHER PUBLICATIONS

Saums et al., "Vaporizable Dielectric Fluid Cooling for IGBT and Power Semiconductor Applications," 27th Annual IEEE Semiconductor Thermal Measurement and Management Symposium, Mar. 20-24, 2011, 2 pp.

(Continued)

*Primary Examiner* — Filip Zec

(74) *Attorney, Agent, or Firm* — Shumaker & Sieffert, P.A.

(57) ABSTRACT

An apparatus includes a driver and both a pump and a compressor mechanically coupled to the driver. The driver includes a first driver chamber and a second driver chamber separated by a moveable driver barrier coupled to a mechanical link. The driver is configured to alternately expand and contract the first and second driver chambers in response to an alternating pressure differential of a gaseous first coolant between a first pressure and a second pressure of the first and second driver chambers and produce a mechanical force from the alternating pressure differential. The pump is configured to pump a liquid first coolant in response to the mechanical force from the driver. The compressor is configured to compress a second coolant in response to the mechanical force from the driver.

20 Claims, 18 Drawing Sheets

(56) References Cited

U.S. PATENT DOCUMENTS

| | | | | |
|---|---|---|---|---|
| 8,529,223 | B2* | 9/2013 | Cohoon | E03D 5/01 |
| | | | | 417/393 |
| 9,395,107 | B2* | 7/2016 | Asari | F25B 7/00 |
| 9,599,395 | B2* | 3/2017 | Yamashita | F25B 6/04 |
| 9,784,106 | B2* | 10/2017 | Luo | F25B 9/145 |
| 9,845,794 | B2* | 12/2017 | Seith | F04B 43/067 |
| 10,888,024 | B1 | 1/2021 | Pichai et al. | |
| 11,339,995 | B2* | 5/2022 | Wehber | F25B 25/005 |
| 11,401,495 | B2* | 8/2022 | Liu | C12M 33/12 |
| 2005/0072800 | A1 | 4/2005 | Smith | |
| 2010/0263881 | A1 | 10/2010 | Fritz | |
| 2012/0045350 | A1 | 2/2012 | Wheal | |
| 2013/0341934 | A1* | 12/2013 | Kawanishi | F03D 9/007 |
| | | | | 290/55 |

OTHER PUBLICATIONS

"Double Diaphragm Pumps Concept and Theory," Graco, Inc., Form No. 321-048 1/96, 1996 (Applicant points out, in accordance with MPEP 609.04(a), that the year of publication, 1996, is sufficiently earlier than the effective U.S. filing date, 2017, so that the particular month of publication is not in issue.) 31 pp.

"Components Overheating," Zutacore, 2015 (Applicant points out, in accordance with MPEP 609.04(a), that the year of publication, 2015, is sufficiently earlier than the effective U.S. filing date, so that the particular month of publication is not in issue.) 4 pp.

Prosecution History from U.S. Appl. No. 16/115,199 dated from Jun. 25, 2020 through Oct. 7, 2020, 26 pp.

* cited by examiner

DATA CENTER REFRIGERATION SYSTEM

This application is a continuation-in-part of U.S. patent application Ser. No. 16/115,199, filed on Aug. 28, 2018, and entitled "DATA CENTER REFRIGERATION SYSTEM," which claims the benefit of U.S. Provisional Patent Application Ser. No. 62/551,064, filed Aug. 28, 2017, and entitled "DATA CENTER REFRIGERATION SYSTEM," the entire content of each of which is incorporated herein by reference.

TECHNICAL FIELD

The invention relates to data center refrigeration systems and, more specifically, to refrigeration systems for computing devices in data centers.

BACKGROUND

Ensuring ambient temperatures within data centers for effective computer processor operations is a significant cost for data center providers. Processors used in high performance computing servers generate a significant amount of heat during operation. Processors typically must operate in a range of ambient temperatures to prevent failure due to overheating. Liquid cooling systems that supply liquid refrigerant to the processors efficiently transfer heat away from the processors.

SUMMARY

In general, techniques are described for powering transportation of refrigerant to recover heat from power generation systems and convert the recovered heat into work for powering one or more thermodynamic cycles. These heat recovery and cooling systems may replace or supplement cooling water systems to cool heat loads in a data center. For example, power generation systems located on-site of a data center may generate flue gas or other hot air stream. Rather than discharge this hot air stream directly into the atmosphere, cooling systems described herein may use a coolant flowing through one or more heat exchangers to remove heat from the hot air stream and exit the one or more heat exchangers as gaseous coolant. A driver uses the gaseous coolant to create a mechanical force used to power the pump circulating the coolant. In addition to driving the pump in the same thermodynamic cycle, the driver may drive a compressor in another thermodynamic cycle. This compressor pressurizes gaseous coolant in the other thermodynamic cycle. The gaseous refrigerant is condensed and circulated to an evaporator to remove heat from another fluid stream. For example, the other fluid stream may be similar to the refrigeration cycle, with a condenser and cooling water system replaced with the evaporator and thermodynamic cycles described above. This evaporator may be a flooded evaporator that may provide a relatively high operating efficiency and corresponding low power input. The cooling system may use a reduced amount of power, as the driver may both pump and compress coolant with reduced electricity or gas, and may be capable of operating with relatively low global warming potential (GWP) coolants and with reduced or no cooling water for condensing the coolant.

In one example, an apparatus includes a driver, a pump mechanically coupled to the driver, and a compressor mechanically coupled to the driver. The driver includes a first driver chamber and a second driver chamber separated by a moveable driver barrier coupled to a mechanical link. The driver is configured to alternately expand and contract the first and second driver chambers in response to an alternating pressure differential of a gaseous first coolant between a first pressure and a second pressure of the first and second driver chambers, respectively, and produce a mechanical force from the alternating pressure differential. The pump is configured to pump a liquid first coolant in response to the mechanical force from the driver. The compressor is configured to compress a second coolant in response to the mechanical force produced by the driver.

In another example, a system includes a pumping apparatus, a first thermodynamic cycle, and a second thermodynamic cycle. The pumping apparatus includes a driver, a pump mechanically coupled to the driver, and a compressor mechanically coupled to the driver. The driver includes a first driver chamber and a second driver chamber separated by a moveable driver barrier coupled to a mechanical link. The driver is configured to alternately expand and contract the first and second driver chambers in response to an alternating pressure differential of a gaseous first coolant between a first pressure and a second pressure of the first and second driver chambers, respectively, and produce a mechanical force from the alternating pressure differential. The pump is configured to pump a liquid first coolant in response to the mechanical force from the driver. The compressor is configured to compress a second coolant in response to the mechanical force produced by the driver. The first thermodynamic cycle is driven by the pump, and is configured to remove heat from a first fluid stream using the first coolant. The second thermodynamic cycle is driven by the compressor, and is configured to remove heat from a second fluid stream using the second coolant.

In another example, a method includes producing, by a driver of a pumping apparatus, an alternating mechanical force from an alternating pressure differential of a gaseous first coolant. The driver includes a first driver chamber and a second driver chamber separated by a moveable driver barrier coupled to a mechanical link. The first and second driver chambers alternately expand and contract in response to the alternating pressure differential of the gaseous first coolant between the first and second driver chambers. The method includes pumping, by a pump of the pumping apparatus and in response to the alternating mechanical force from the driver, a liquid first coolant in a first thermodynamic cycle to remove heat from a first fluid stream, and compressing, by a compressor of the pumping apparatus and in response to the alternating mechanical force from the driver, a second coolant in a second thermodynamic cycle to remove heat from a second fluid stream.

This disclosure also describes methods, computer readable storage media, computing devices, systems, for performing techniques described herein. The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference characters denote like elements throughout the figures and text.

DETAILED DESCRIPTION

Figure 1:
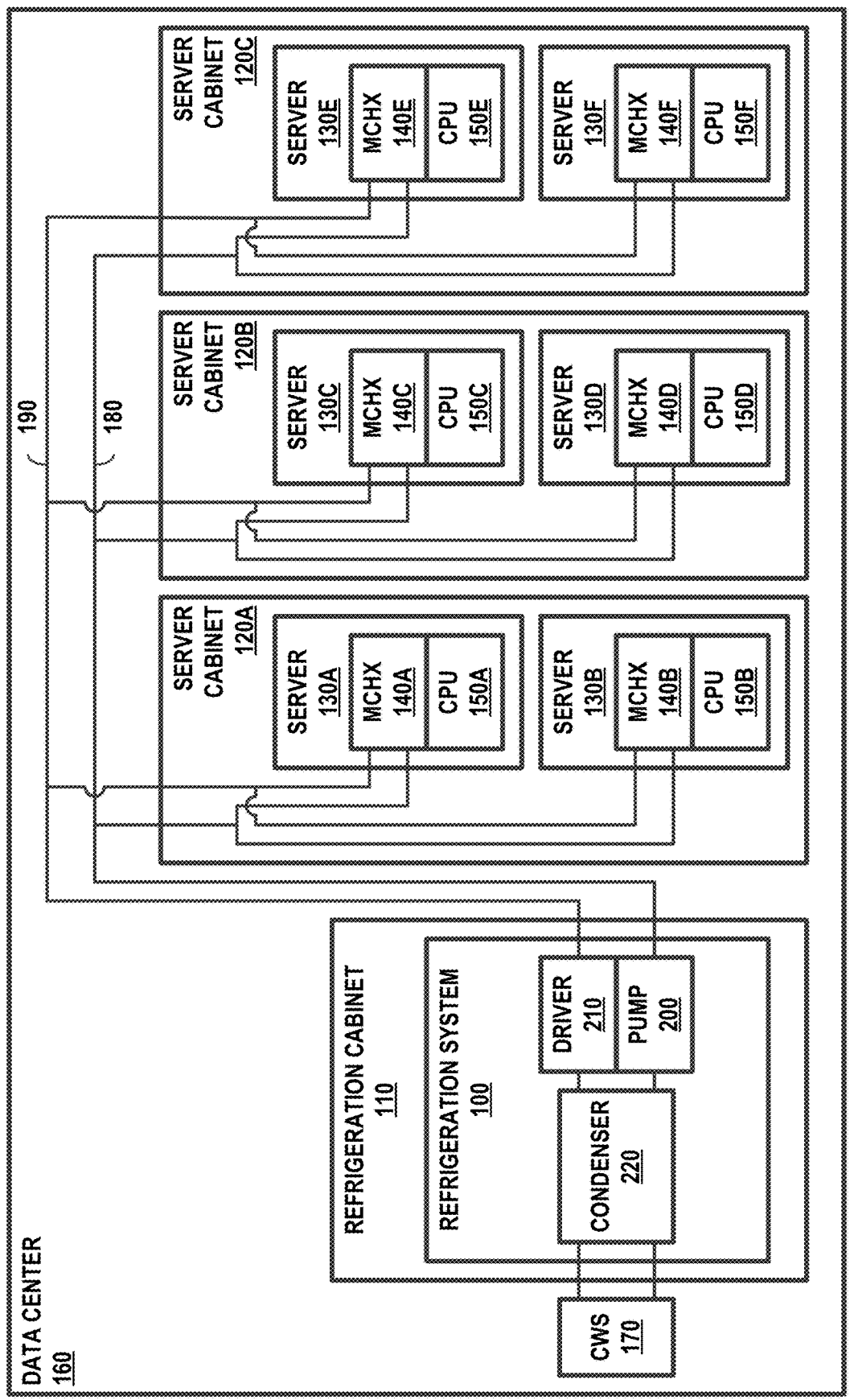
FIG. 1 is a block diagram illustrating a high-level view of an example data center that includes a refrigeration system, in accordance with techniques described herein.

A data center may use a refrigeration system to remove heat from operating processors. FIG. 1 is a block diagram illustrating a high-level view of an example data center 160 that includes a refrigeration system 100 for cooling one or more processors 150A-F (illustrated as central processing units ("CPUs"), referred to individually as "CPU 150" and collectively as "CPUs 150") using one or more heat exchangers 140A-F ("HEX", referred to individually as "HEX 140" and collectively as "HEXs 140"), in accordance with techniques described herein. Rather than provide bulk, convective cooling as in air cooling, HEXs 140 may provide localized heat removal from CPUs 150 using refrigerant.

Data center 160 may include one or more server cabinets 120A-C (referred to individually as "server cabinet 120" and collectively as "server cabinets 120"). While three server cabinets are shown, a data center may have any number of server cabinets. In some examples, server cabinets 120 may be owned, leased, or otherwise assigned to one or more customers or tenants of the data center, such that the customer maintains custody of the contents of the respective server cabinet 120. Data center 160 may also include a refrigeration cabinet 110 that includes a refrigeration system 100. Refrigeration cabinet 110 may be located separate from server cabinets 120, such as in another room or building. In some examples, refrigeration cabinet 110 may be owned or otherwise controlled by an operator of data center 160, such that refrigeration system 100 is configured to provide a cooling service to a customer of server cabinets 120. Cooling water system 170 ("CWS") may be fluidically coupled to refrigeration system 100 and configured to remove heat from refrigeration system 100. In some examples, CWS 170 may be controlled by a third party, such as a municipality or company, while in other examples, CWS 170 may be part of data center 160.

Each server cabinet 120 may be configured to store one or more servers 130A-F (referred to individually as "server 130" and collectively as "servers 130"). Each server 130 may include one or more CPUs 150 thermally coupled to one or more HEXs 140. Each CPU 150 may be configured to provide processing power to a respective server 130. Examples of CPU 150 may include any one or more of a microprocessor, controller, digital signal processor (DSP), application specific integrated circuit (ASIC), field-programmable gate array (FPGA), or equivalent discrete or integrated logic circuitry. While only one CPU 150 is shown for each server 130, each server 130 may have multiple CPUs 150.

During operation, CPUs 150 produce heat which must be removed to prevent overheating. Each HEX 140 is configured to remove heat from a corresponding CPU 150. While only one HEX 140 is shown for each server 130, each server 130 may have multiple HEXs, and each HEX 140 may remove heat from one or more CPUs 150 in some examples. HEX 140 may be thermally coupled to at least one surface of CPU 150 directly, through a conductive medium such as a thermally conductive adhesive, or by any other mechanism that provides for conductive heat transfer from CPU 150 to HEX 140. In some examples, HEX 140 may be thermally coupled to more than one CPU 150, such as in a sandwiched configuration or through a contoured contact surface. HEX 140 may include one or more ("a plurality of") channels. In some examples, each of the one or more channels of HEX 140 may have a diameter in a range from about $\frac{1}{64}$ inch to about $\frac{1}{8}$ inch. In some examples, HEX 140 may be a microchannel heat exchanger and the one or more channels may be microchannels having a diameter less than or equal to about 1 mm. Each HEX may be configured to receive a refrigerant at a channel inlet and discharge the refrigerant at a channel outlet. HEX 140 may be configured to accommodate two phases of the refrigerant during operation, such that the channel inlet receives liquid refrigerant and the channel outlet discharges gaseous refrigerant.

Each HEX 140 may be fluidically coupled to refrigeration system 100 through refrigeration piping. Refrigeration system 100 may use refrigerant to remove heat from CPU(s) 150. Refrigeration system 100 may be configured to remove heat from HEXs 140 by supplying refrigerant to and removing refrigerant from HEXs 140. Refrigerant may be selected such that refrigerant enters HEX 140 as subcooled liquid and exits HEX 140 as superheated vapor for the particular operating conditions at which refrigeration system 100 and CPU(s) 150 are intended to operate. For example, the refrigerant may be selected for use in refrigeration system 100 such that the properties of the refrigerant, such as temperature and pressure, may be controlled through all stages of the refrigeration cycle to maintain CPU(s) 150 at a junction temperature below a temperature threshold or setpoint. In some examples, the junction temperature may be substantially higher (for example, at about 190° F.) than a boiling temperature of the refrigerant, such that the refrigerant will readily vaporize.

The refrigerant may be any non-conductive, non-flammable fluid. Factors for selecting refrigerant may include boiling point, heat capacity, CPU operating temperature, refrigerant saturation temperature and pressure, specific enthalpy, condenser water system operating temperature, and other factors that affect phase change, thermal, physical, and/or chemical stability, or economic and safety considerations of the refrigerant. Refrigeration piping may include liquid refrigerant piping 180 for supplying subcooled liquid refrigerant to HEXs 140 and gaseous refrigerant piping 190 for discharging superheated vapor refrigerant from HEXs 140. Refrigeration system 100 may include a pump 200, a driver 210, and a condenser 220 that are configured such that heat removed from HEXs 140 may be used by driver 210 to power pump 200, as will be described in more detail in FIGS. 2-6 below.

During operation, refrigeration system 100 may pump subcooled liquid refrigerant from refrigeration cabinet 110 to server cabinets 120. Liquid refrigerant enters HEXs 140, removes heat from HEXs 140 at a channel interface, and exits HEXs 140 as superheated gaseous refrigerant. The superheated gaseous refrigerant is transported to refrigeration system 100, where it is used to pressurize driver 210 and, in turn, power pump 200 before being condensed by cooling water from CWS 170. By remotely supplying refrigerant to locally cool CPUs 150, refrigeration system 100 may safely and efficiently keep CPUs 150 below a threshold temperature.

Refrigeration systems may require substantial power to circulate refrigerant through small and remote heat exchangers. For example, a heat exchanger configured to remove heat from a processor may have channels less than 1 mm, requiring substantial pumping power to pump refrigerant through the channels. The processors cooled by the refrigeration system may be located a significant distance from the refrigeration system, requiring substantial pumping power to pump refrigerant to each server cabinet. Further, power requirements may fluctuate as servers use varying amounts of power and produce varying amounts of heat, resulting in equipment sized and maintained for high levels of service that may not be needed.

Figure 2:
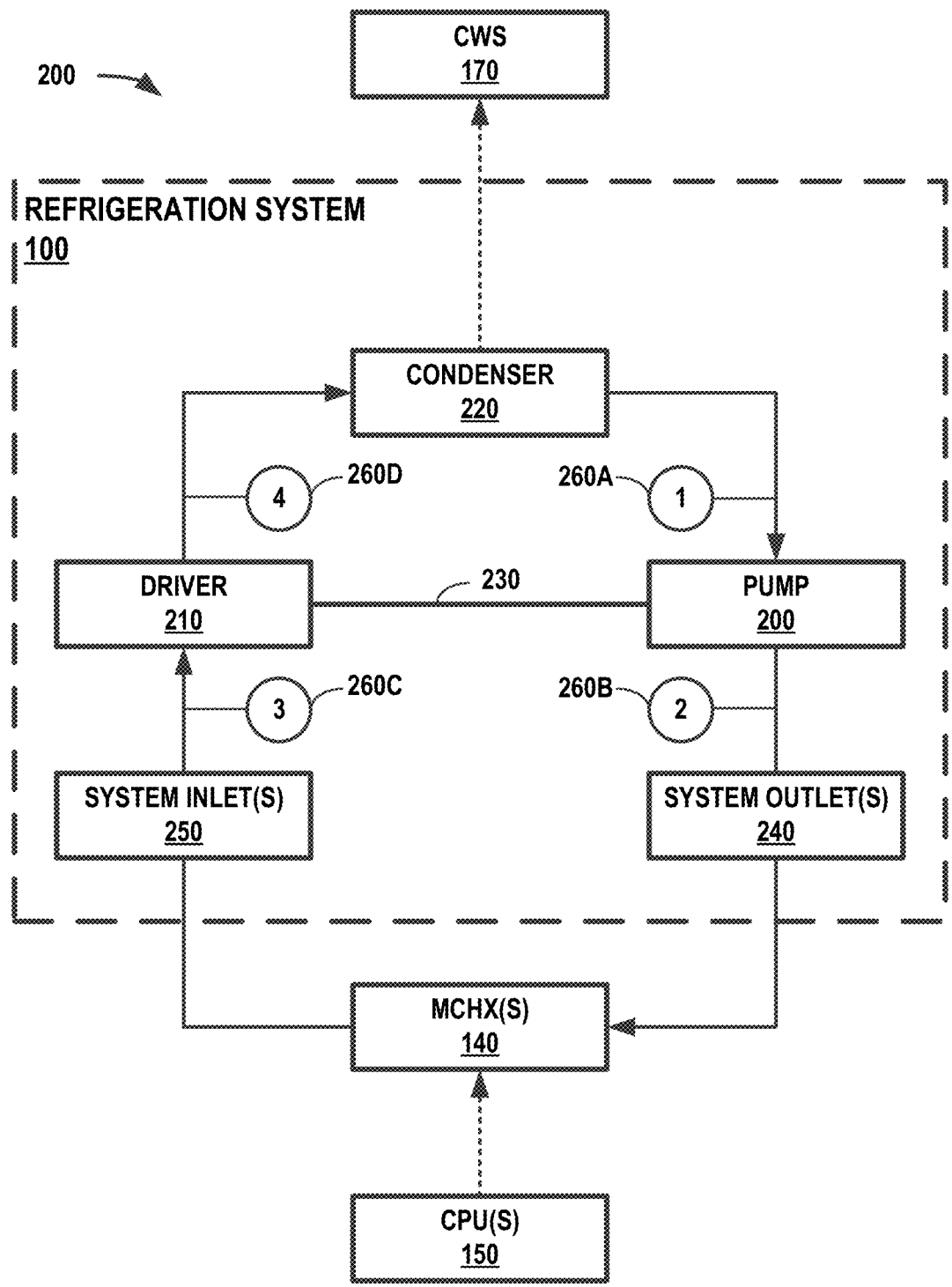
FIG. 2 is a block diagram illustrating a high-level view of an example refrigeration system, in accordance with techniques described herein.

According to principles of the disclosure, a refrigeration system may remove heat from one or more processors and convert a portion of the heat to mechanical energy used to pump refrigerant through the refrigeration system. FIG. 2 is a block diagram that illustrates a high-level view of a system 200 for removing heat from a CPU 150, in accordance with techniques described herein. System 200 may include one or more CPU(s) 150, each thermally coupled to one or more HEX(s) 140, and a refrigeration system 100 fluidically coupled to one or more HEX(s) 140 on a hot side and CWS 170 on a cold side, as described in FIG. 1. Refrigeration system 100 may include one or more system inlet(s) 250, one or more system outlet(s) 240, a driver 210, a pump 200, and a condenser 220. Refrigeration system 100 may be configured to remove heat from HEXs 140 by supplying refrigerant to and removing refrigerant from HEXs 140 using reduced energy inputs.

System inlet(s) 250 and system outlet(s) 240 may represent connection points of one or more HEX(s) 140 to refrigeration system 100. System inlet 250 and system outlet 240 may be configured to fluidically couple to an outlet and an inlet, respectively, of one or more HEX(s) 140. Once coupled, system inlet 250 may be configured to receive gaseous refrigerant from the outlet of the one or more HEX(s) 140, while system outlet 240 may be configured to discharge liquid refrigerant to the inlet of the one or more HEX(s) 140. In some examples, system inlet 250 or system outlet 240 may include a single connection, such as a flange. In some examples, system inlet(s) 250 may be configured to receive substantially gaseous refrigerant and system outlet(s) 240 may be configured to discharge substantially liquid refrigerant.

In some examples, system inlet(s) 250 and system outlet(s) may include multiple connections, such as a manifold. In some examples, system inlet 250 and system outlet 240 may include at least one connection for each server cabinet or each customer cage. For example, each server cabinet may include a manifold coupled to a main branch of refrigeration system 100. In the example of FIG. 1, each server cabinet includes two servers 130. An outlet of each HEX 140 of the servers 130 may be fluidically coupled to a system inlet manifold. Similarly, an inlet of each HEX 140 may be coupled to a system outlet manifold. Each system inlet manifold and system outlet manifold may represent the respective system inlet 250 and system outlet 240. The manifold may be configured with multiple system outlets 240, each system outlet 240 configured to distribute refrigerant to each HEX 140 in the respective server cabinet. In some examples, each manifold may include additional control equipment for the corresponding server cabinet. For example, the manifold may include a temperature regulating device configured to maintain a particular temperature or saturation of gaseous refrigerant exiting HEX 140, such as superheat of the gaseous refrigerant. Each system outlet 240 to a HEX 140 may include a flow regulating valve configured to maintain a superheated gaseous refrigerant at an outlet of HEX 140.

Pump 200 may be configured to pump refrigerant through refrigeration system 100. Pump 200 may be fluidically coupled to condenser 220 and system outlet(s) 240. Pump 200 may be mechanically coupled to driver 210 through mechanical link 230. Pump 200 may be configured to receive liquid refrigerant at a first pressure from condenser 220 and discharge liquid refrigerant at a second pressure to system outlet(s) 240 in response to a mechanical force from driver 210. Pump 200 may include any positive displacement pump that can translate an alternating mechanical force into liquid refrigerant displacement, including any one of diaphragm pumps, piston pumps, and the like. Pump 200 may include one or more inlets and one or more outlets. In some examples in which pump 200 is a piston or diaphragm pump, pump 200 may have two inlets and two outlets, as will be described later in FIGS. 3, 4A, and 4B.

Driver 210 may be configured to drive pump 200 through expansion using gaseous refrigerant vaporized in HEX(s) 140 by heat exhausted from CPU(s) 150. Driver 210 may be fluidically coupled to system inlet(s) 250 and condenser 220. Driver 210 may be mechanically coupled to pump 200 through mechanical link 230. Driver 210 may be configured to receive gaseous refrigerant at a third pressure from system inlet(s) 250 and discharge gaseous refrigerant at a fourth pressure to condenser 220. In some instances, the third pressure may be substantially similar to the second pressure discharged by pump 200, and the fourth pressure may be substantially similar to the first pressure received by pump 200. Driver 210 may control the gaseous refrigerant to produce a pressure differential between the first and second pressure that, in turn, expands a chamber of driver 210 to produce the mechanical force. Driver 210 may include any fluid driver than can translate a pressure differential caused by gaseous refrigerant into a mechanical force, including any one of diaphragm drivers, piston drivers, and the like. Driver 210 may include one or more inlets and one or more outlets. In some examples in which driver 210 is a piston or diaphragm driver, driver 210 may have two inlets and two outlets, as will be described later in FIGS. 3, 4A, and 4B.

Mechanical link 230 may be mechanically coupled to pump 200 and driver 210. Mechanical link 230 may be configured to transfer the mechanical force from driver 210 to pump 200. Mechanical link 230 may be any mechanical connection that can transfer the mechanical force, including simple mechanical devices, such as rods and shafts; complex mechanical devices, such as gearboxes and translational machines; fluid systems, such as hydraulic systems; and the like.

Condenser 220 may be configured to condense the refrigerant from the gaseous refrigerant to the liquid refrigerant. Condenser 220 may be fluidically coupled to driver 210 and pump 200 on a hot side and configured to receive refrigerant from driver 210 and discharge refrigerant to pump 200. Condenser 220 may be fluidically coupled to CWS 170 on a cold side and configured to receive cooling water from and discharge cooling water to CWS 170. Condenser 220 may include any two-phase heat exchanger including shell and tube, finned tube, and the like.

Figure 6:
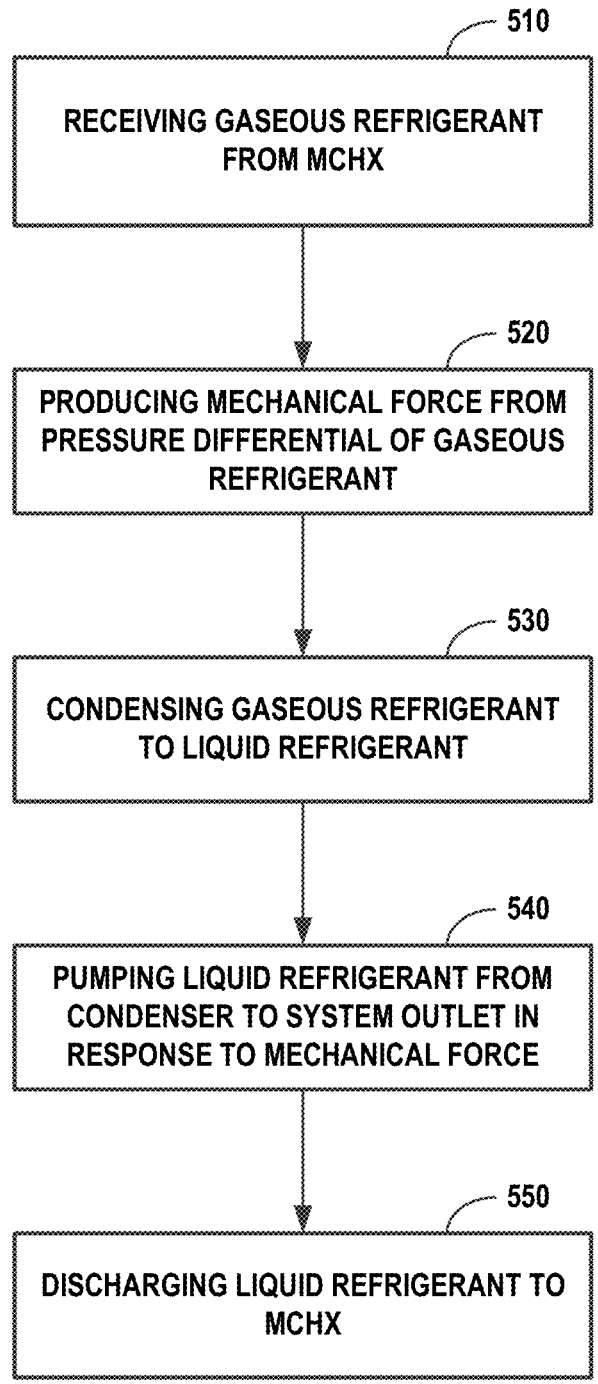
FIG. 6 is an example flow diagram of a process for cooling a CPU using a refrigeration system, in accordance with techniques described herein.

Refrigeration system 100 may operate to remove heat from CPU(s) by circulating refrigerant through HEX(s) 140 using a mechanical force generated from heat removed from the processors. FIG. 6 is an example flow diagram of a process for cooling a CPUs 150 using refrigeration system 100. FIG. 6 may be described with reference to FIG. 2, including refrigeration state point (1) 260A, state point (2) 260B, state point (3) 260C, and state point (4) 260D; however, it is understood that the FIG. 6 may be implemented using other systems, and that FIG. 2 may implement other methods. A system inlet, such as system inlet 250, may receive gaseous refrigerant from at least one heat exchanger, such as HEX(s) 140 (510). The system inlet may be fluidically coupled to a driver, such as driver 210, and the at least one heat exchanger. The driver may produce a mechanical force from a pressure differential of the gaseous refrigerant (520), such as between a pressure of state (3) 260C and a pressure of state (4) 260D. The driver may be mechanically coupled to a pump, such as pump 200. A condenser, such as condenser 220, may condense the gaseous refrigerant to a liquid refrigerant (530), such as from a temperature and pressure of state (4) 260D to a temperature and pressure of state (1) 260A. The condenser may be fluidically coupled to the driver and the pump. The pump may pump the liquid refrigerant from the condenser to a system outlet, such as system outlet 240, in response to the mechanical force from the driver (540), such as from a pressure of state (1) 260A to a pressure of state (2) 260B. The system outlet may discharge the liquid refrigerant to the at least one heat exchanger (550). The system outlet may be fluidically coupled to the pump and the at least one heat exchanger. The heat exchanger may heat liquid refrigerant to a gaseous refrigerant, such as from a temperature of state (2) 260B to a temperature of state (3) 260C. By using heat from CPU(s) 150 to create a motive force for powering pump 200, refrigerant system 100 may require less electrical power than a system that solely uses electrical power to pump refrigerant.

As described in FIG. 2, driver 210 and pump 200 may produce a mechanical force from a pressure differential of gaseous refrigerant and use the mechanical force to pump liquid refrigerant. The gaseous refrigerant may have a higher enthalpy than the liquid refrigerant due to heating of the refrigerant by HEX 140. The pressure differential in driver 210 may be created by a higher pressure gaseous refrigerant entering into a first chamber of driver 210 from HEX 140 and a lower pressure gaseous refrigerant exiting from a second chamber of driver 210 to condenser 220. The pressure differential may drive expansion of the first chamber of driver 210 to create the mechanical force that powers pump 200. In this way, heat produced by CPU 150 may be converted to mechanical energy that powers circulation of refrigeration system 100.

Figure 3:
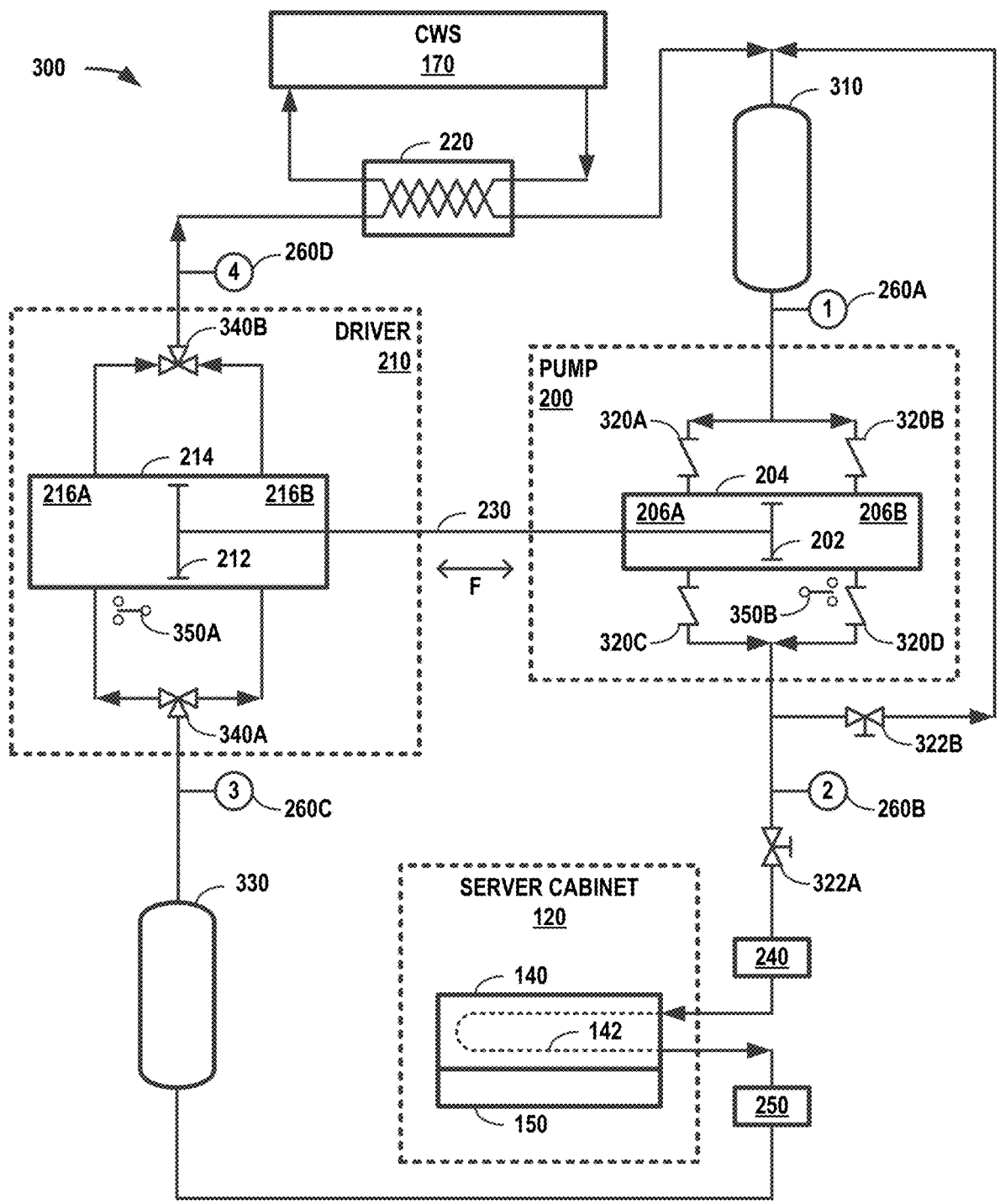
FIG. 3 is an example instrumentation diagram illustrating a component-level view of an example refrigeration system, in accordance with techniques described herein.

FIG. 3 is an instrumentation diagram illustrating a component-level view of an example refrigeration system, in accordance with techniques described herein. In the example of FIG. 3, system 300 includes a two-phase refrigerant that is circulated by a piston pump and driver, as will be described below. However, other equipment and configurations may be used, as would be consistent with the principles of the disclosure.

System 300 may include a liquid receiver 310. Liquid receiver 310 may be fluidically coupled to condenser 220 and pump 200 through pump inlet valves 310A and 310B. Liquid receiver 310 may be configured to store pressurized, subcooled liquid refrigerant. Liquid receiver 310 may receive liquid refrigerant from condenser 220 and supply liquid refrigerant to pump 200. Liquid receiver 310 may be any vessel that stores liquid refrigerant under pressure, such as pressures in a range from about 50 psig to about 125 psig.

System 300 includes pump 200. Pump 200 may be fluidically coupled to liquid receiver 310 through pump inlet valves 320A and 320B and fluidically coupled to HEX 140 through pump outlet valves 320C and 320D (collectively "pump valves 320"). Pump valves 320 may be configured to direct flow into and out of pump 200. For example, one of pump inlet valves 320A and 320B may allow liquid to flow from receiver 310 into pump 200 while the other of pump inlet valves 320A and 320B may prevent flow of liquid from pump 200 back into receiver 310. Similarly, one of pump outlet valves 320C and 320D may allow liquid to flow from pump 200 to HEX 140, while the other of pump outlet valves 320C and 320D may prevent flow from HEX 140 back into pump 200. In the example of FIG. 3, pump inlet valves 310A and 310B and pump outlet valves 310C and 310D are check valves. In other examples, the four pump valves 320 may be replaced with two respective 3-way valves.

Pump 200 may include a pump vessel 204 and a moveable pump barrier, such as piston 202. In the example of FIG. 3, piston 202 may separate vessel 204 into two variable volume pump chambers 206A and 206B. Pump 200 may be configured to alternately expand and contract the first and second pump chambers 206A and 206B in response to the mechanical force from driver 210.

Pump chamber 206A may be fluidically coupled to pump inlet valve 320A and pump outlet valve 320C, while pump chamber 206B may be fluidically coupled to pump inlet valve 320B and pump outlet valve 320D. Piston 202 may be coupled to mechanical link 230 and configured to move in response to a mechanical force from driver 210. In some examples, the mechanical force may be a linear force, while in other examples, a mechanical advantage of mechanical link 230 may be adjusted, such as through gearing or levered mechanisms. Movement of piston 202 alternatingly increases or decreases a volume of chamber 206A and 206B in reverse direction to one another, such that a first volume of fluid may flow out of the decreasing volume and a second volume of fluid may flow into the increasing volume. In the example of FIG. 3, pump 200 uses a piston; however, in other examples, piston 202 may be replaced with a diaphragm or other moveable driver barrier that can change a volume of one or more chambers in response to mechanical force F.

As discussed in FIG. 2, pump 200 may include any positive displacement pump capable of translating a reciprocating mechanical force into liquid refrigerant displacement. In the example of FIG. 3, pump 200 may be a piston or diaphragm capable of translating a linear reciprocating mechanical force into fluid displacement. In other examples, pump 200 may be a rotary positive displacement pump capable of translating a linear reciprocating mechanical force into a rotary force that displaces liquid refrigerant.

System 300 may include system outlet(s) 240 and system inlet(s) 250. While system outlet(s) 240 and system inlet(s) 250 are shown coupled to a single HEX 140 in a single server cabinet 120, system outlet(s) 240 and system inlet(s) 250 may be fluidically coupled to a plurality of HEX(s) 140 in one or more server cabinets 120, as in the example data center 160 of FIG. 1. In some examples, system outlet(s) 240 and system inlet(s) 250 may include components for controlling refrigerant flow into and out of HEX 140, such that, for example, the components of system outlet(s) 240 and system inlet(s) 250 may control a temperature of the gaseous refrigerant exiting HEX(s) 140 to maintain a superheat of the gaseous refrigerant.

System 300 may include flow regulating valves 322A and 322B (collectively "flow regulating valves 322") coupled to an outlet of pump 200. Flow regulating valve 322A may be further coupled to HEX 140 and configured to control flow of liquid refrigerant into HEX 140, temperature out of HEX 140, and/or flow of gas out of HEX 140, such as to maintain a temperature or superheat of gaseous refrigerant exiting HEX 140. Flor regulating valve 322B may be further coupled to receiver 310 and configured to recycle liquid back to receiver 310. Flow regulating valves 322 may operate together to maintain a particular flow rate to HEX 140. For example, flow regulating valves 322 may control flow of liquid into HEX by increasing or decreasing flow of liquid into HEX 140 while correspondingly decreasing or increasing recycle flow into receiver 310. While flow regulating valves 322A and 322B have been described as including a throttling function, in other examples, flow regulating valves 322A and 322B may be replaced with other flow or pressure regulating valves. For example, flow regulating valve 322A may be replaced with an isolation valve to reduce backflow from HEX 140, while flow regulating valve 322B may be a back-pressure regulating valve to maintain a recirculation pressure. While shown upstream of system outlet 240, flow regulating valve 322A, or any other flow control valve for regulating flow from pump 200 into HEX 140, may be located at any position between an outlet of pump 200 and an inlet of HEX 140.

System 300 may include HEX 140. HEX 140 may be fluidically coupled to pump 200 and a gas accumulator 330. In the example of FIG. 3, HEX 140 may be a heat exchanger that includes channels 142; however, in other examples, HEX 140 may have alternative designs. HEX 140 may be configured to transfer heat from CPU 150 to liquid refrigerant. Factors for which HEX 140 may be designed include, but are not limited to, refrigerant viscosity, refrigerant heat capacity, HEX material thermal conductivity, CPU 150 heat generation, and other factors that may affect heat transfer, whether conductive or convective, from CPU 150 to HEX 140 and from HEX 140 to the refrigerant.

System 300 may include gas accumulator 330. Gas accumulator 330 may be fluidically coupled to HEX 140 and driver 210 through driver inlet valve 340A. Gas accumulator 330 may be configured to store pressurized, superheated gaseous refrigerant. Gas accumulator 330 may receive gaseous refrigerant from HEX 140 and supply gaseous refrigerant to driver 210. Gas accumulator 330 may be any vessel that stores gaseous refrigerant under pressure, such as pressures in a range from about 125 psig to about 250 psig.

System 300 includes driver 210. Driver 210 may be fluidically coupled to gas accumulator 330 through driver inlet valve 340A and fluidically coupled to condenser 220 through driver outlet valve 340B (collectively "driver valves 340"). Driver valves 340 may be configured to direct flow into and out of driver 210. For example, driver inlet valve 340A may direct flow of gas from gas accumulator 330 into a first chamber of driver 210 and prevent flow of gas from gas accumulator 330 into a second chamber of driver 210. Concurrently, driver outlet valve 340B may allow gas to flow from the second chamber of driver 210 to condenser 220 and prevent flow from the first chamber of driver 210. In the example of FIG. 3, driver inlet valve 340A and driver outlet valve 340B are 3-way valves.

Driver 210 may include a driver vessel 214 and a moveable driver barrier, such as piston 212. In the example of FIG. 3, piston 212 may separate vessel 214 into two variable volume driver chambers 216A and 216B. In the example of FIG. 3, driver 210 uses a piston; however, in other examples, piston 212 may be replaced with a diaphragm or other reciprocating barrier that can change a volume of one or more chambers of driver 210. Driver 210 may be configured to alternately expand and contract the first and second driver chambers 216A and 216B in response to an alternating pressure differential.

Each of driver chambers 216A and 216B may be fluidically coupled to driver inlet valve 340A and driver outlet valve 340B. Driver 210 may create the alternating pressure differential by alternately supplying gaseous refrigerant at a higher pressure to one of the first and second driver chambers 216A and 216B using driver inlet valve 340A and discharging gaseous refrigerant at a lower pressure from the other of the first and second driver chambers 216A and 216B using driver outlet valve 340B. Driver valves 340 may be configured to produce a mechanical force F by creating a pressure differential between chamber 216A and 216B and expanding one of chambers 216A and 216B. As will be described in more detail in FIGS. 4A and 4B, driver inlet valve 340A may direct gaseous refrigerant into one chamber to pressurize the chamber, and driver outlet valve 340B may direct gaseous refrigerant out of the other chamber to depressurize the other chamber. Piston 212 may be coupled to mechanical link 230. The pressure differential across piston 212 between the pressurized chamber and the depressurized chamber may move piston 212 across vessel 214, which may create mechanical force F through mechanical link 230. Mechanical link 230 couples piston 212 of driver 210 to piston 202 of pump 200 and in this way transfers mechanical force F from driver 210 to pump 200.

System 300 may include switch circuitry such as switch 350A and switch 350B (collectively "switches 350"). Switch 350A may be adjacent driver chamber 216A and switch 350B may be adjacent pump chamber 206B. Switch 350A and switch 350B may be operationally coupled to piston 212 and piston 202, respectively. Switch 350A may be configured to close when piston 212 is positioned near switch 350A, while switch 350B may be configured to close when piston 202 is positioned near switch 350B. Switches 350 may also be operationally coupled to driver valves 340. Switches 350 may detect when a corresponding piston 202, 212, reaches a particular position in corresponding vessel 204, 214. In response to detection of the piston at the particular position, driver valves 350 may switch energized state to reverse the pressure differential across the respective piston and, correspondingly, a direction of mechanical force F. While switches 350 have been described with respect to adjacency to both driver 210 and pump 200, in some examples, switches 350 may be adjacent either to driver chamber 216A and 216B and operationally coupled to piston 212 or to pump chambers 206A and 206B and operationally coupled to piston 202, such that switch circuitry corresponds to either driver 210 or pump 200.

System 300 may include condenser 220. Condenser 220 may be fluidically coupled on a refrigerant side to driver 210 and liquid receiver 310. Condenser 220 may be fluidically coupled on a cooling fluid side to CWS 170. Condenser 220 may be configured to condense gaseous refrigerant. Condenser 220 may receive gaseous refrigerant from driver outlet valve 340B, cool the gaseous refrigerant to obtain liquid refrigerant, and discharge liquid refrigerant to liquid receiver 310. While condenser 220 is described as a shell and tube condenser, condenser 220 may have a variety of forms.

System 300 may include instrumentation for measuring operating conditions of system 300. For example, each state point (1), (2), (3), and (4) 260A-D may include a temperature sensor, such as a thermocouple, configured to detect a refrigerant temperature, and a pressure sensor, such as a pressure transducer, configured to detect a refrigerant pressure. State points (1)-(4) 260A-D may be used to control components of system 300 including, but not limited to, flow regulating valves 322, driver valves 340, cooling water control valves, and the like. Other instrumentation that may be used includes flow meters, such as flow meters for cooling water of CWS 170 and refrigerant; temperature sensors, such as temperature of cooling water and CPU 150, and the like.

While driver 210 and pump 200 have been described as separate units, in some examples, driver 210 and pump 200 may be contained in a same casing or housing. For example, a pump/driver unit may include pump 200, driver 210, pump valves 320, driver valves 340, switches 350, and a controller (not shown). The pump/driver unit may be configured with a variety of design characteristics that include, but are not limited to, surface area ratio of pistons 202 and 210, diameters of vessels 204 and 214, lengths of vessels 204 and 214, number of chambers of vessels 204 and 214, and other design characteristics that may affect the mechanical force generated and transferred through the pump/driver unit. Further, any of these design characteristics may present in individual components, such as pump 200 and driver 210.

Figure 4A:
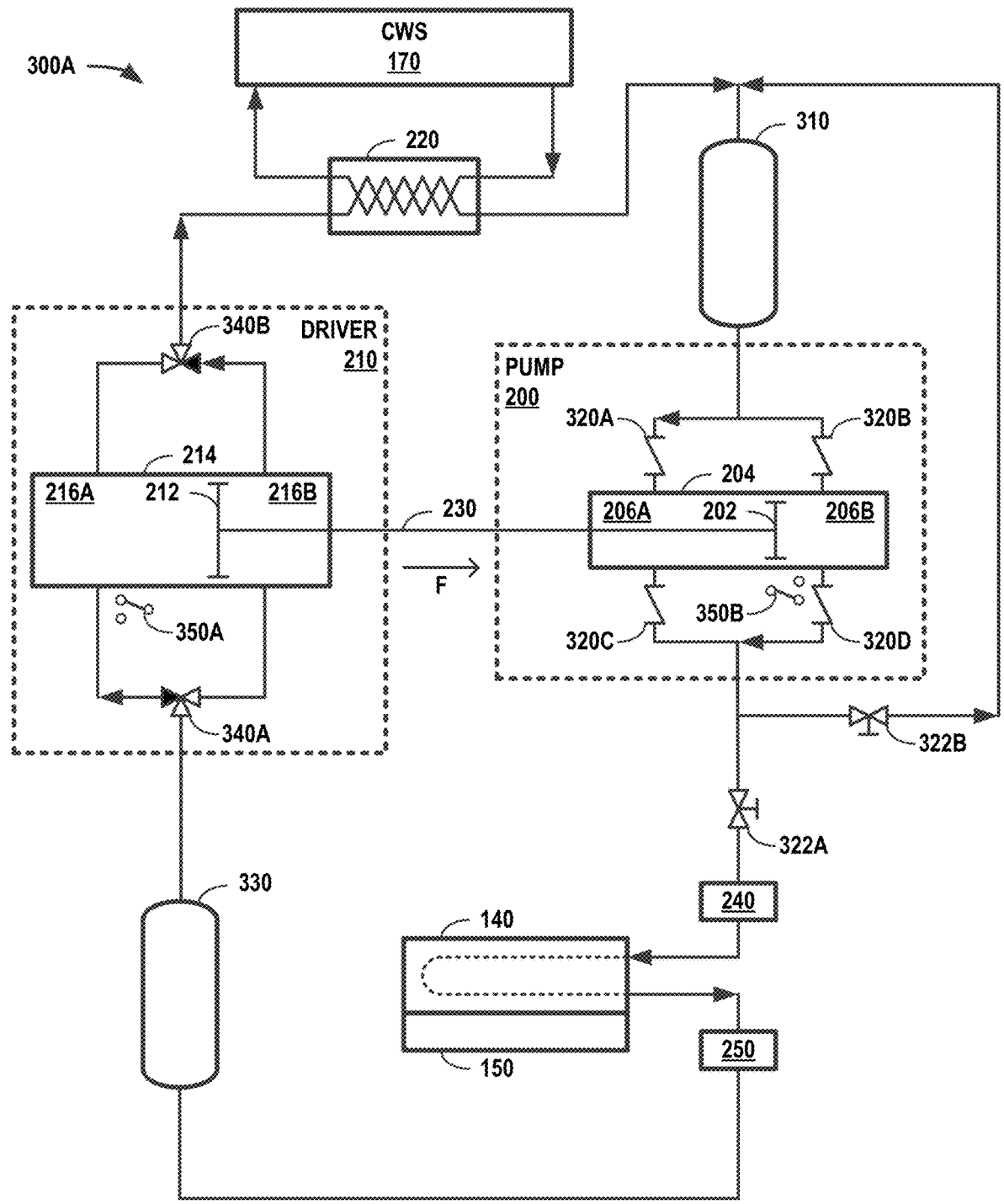
FIG. 4A is an example instrumentation diagram of the system of FIG. 3 at a first state A, in accordance with techniques described herein.

FIG. 4A is an example instrumentation diagram of the system 300A of FIG. 3 at a first state A, in accordance with techniques described herein. System 300A at state A may be configured to receive gaseous refrigerant from gas accumulator 330 into chamber 216A. Switch 350A may be in a "closed" position. Driver inlet valve 340A may direct gaseous refrigerant into chamber 216A while driver outlet valve 340B may direct gaseous refrigerant out of chamber 216B. This may pressurize chamber 216A and depressurize chamber 216B, creating a pressure differential across piston 212. Chamber 216A may expand and chamber 216B may collapse, which causes piston 212 to move to the right (in the example configuration and orientation of system 300 illustrated in FIGS. 3-4D). The movement of piston 212 to the right creates a mechanical force F to the right in mechanical link 230.

Mechanical link 230 exerts the mechanical force F on piston 202. Piston 202 moves to the right in response to the mechanical force F, expanding chamber 206A and collapsing chamber 206B. The expanding chamber 206A creates a suction that draws a first volume of liquid refrigerant through pump inlet valve 320A into chamber 206A from liquid receiver 310. Collapsing chamber 206B creates pressure that pushes a second volume of liquid refrigerant through pump outlet valve 320D into HEX 140 from chamber 206B.

Figure 4B:
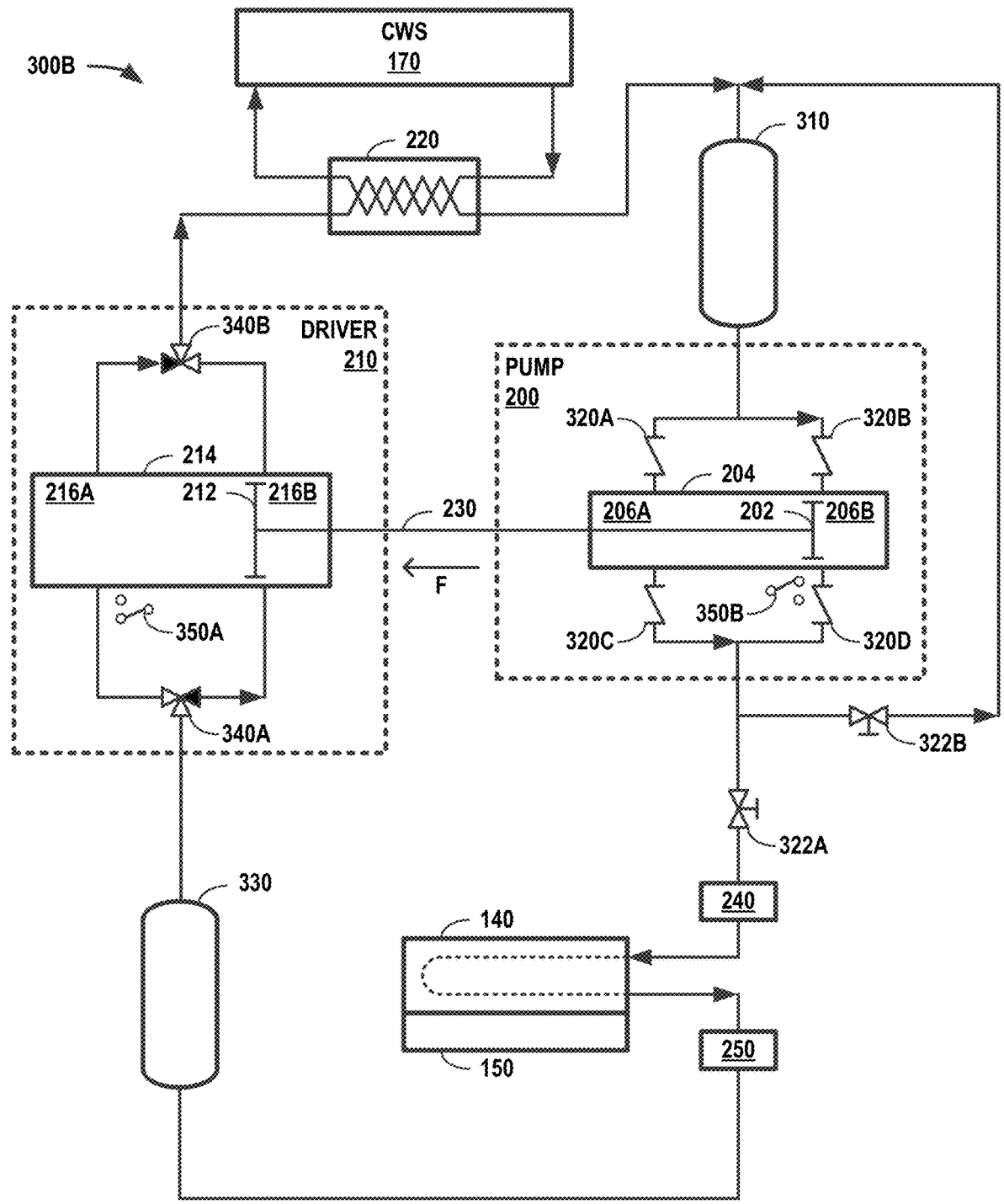
FIG. 4B is an example instrumentation diagram of the system of FIG. 3 transitioning from the first state A to a second state B, in accordance with techniques described herein.

FIG. 4B is an example instrumentation diagram of the system 300B of FIG. 3 transitioning from the first state A to a second state B. Piston 212 may move to a position that causes switch 350B to move to a "closed" position. The "closed" position of switch 350B may be associated with state B. The "closed" position of switch 350B may cause driver inlet valve 340A and driver outlet valve 340B to be "deenergized". Once deenergized, driver inlet valve 340A may direct gaseous refrigerant into chamber 216B while driver outlet valve 340B may direct gaseous refrigerant out of chamber 216A.

Figure 4C:
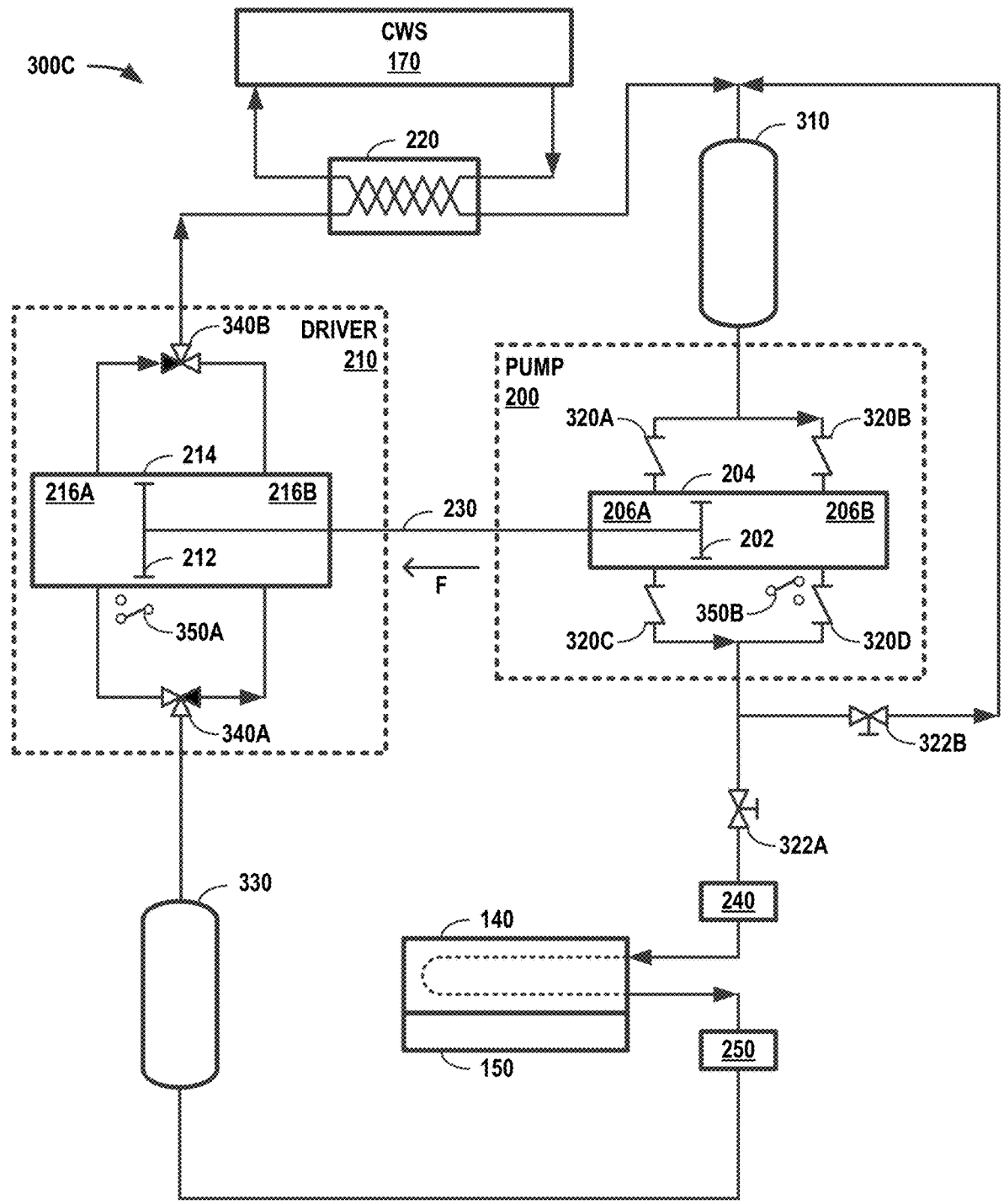
FIG. 4C is an example instrumentation diagram of the system of FIG. 3 at the second state B, in accordance with techniques described herein.

FIG. 4C is an example instrumentation diagram of the system 300C of FIG. 3 at the second state B, in accordance with techniques described herein. System 300B at state B may be configured to receive gaseous refrigerant into chamber 216B. Switch 350B may be in a "closed" position. Driver inlet valve 340A may direct gaseous refrigerant into chamber 216B while driver outlet valve 340B may direct gaseous refrigerant out of chamber 216A. This may pressurize chamber 216B and depressurize chamber 216A, creating a pressure differential across piston 212. Chamber 216B may expand and chamber 216A may collapse, which causes piston 212 to move to the left (in the example configuration and orientation of system 300 illustrated in FIGS. 3-4D). The movement of piston 212 to the left creates a mechanical force F to the left in mechanical link 230. Driver inlet valve 340A and driver outlet valve 340B operate in a reciprocal manner such that fluidical connectivity between the inlet of driver inlet valve 340A and outlet of driver outlet valve 340B is avoided. For example, in state B the inlet to driver outlet value 340B from driver chamber 216B is closed while the outlet of driver inlet value 340A to driver chamber 216B is open. In this way, direct fluidical connectivity between gas accumulator 330 and condenser 220 is avoided.

Mechanical link 230 exerts the mechanical force F on piston 202. Piston 202 moves to the left in response to the mechanical force F, expanding chamber 206B and collapsing chamber 206A. The expanding chamber 206B creates a suction that draws liquid refrigerant through pump inlet valve 320B into chamber 206B from liquid receiver 310. Collapsing chamber 206A creates pressure that pushes liquid refrigerant through pump outlet valve 320C into HEX 140 from chamber 206A.

Figure 4D:
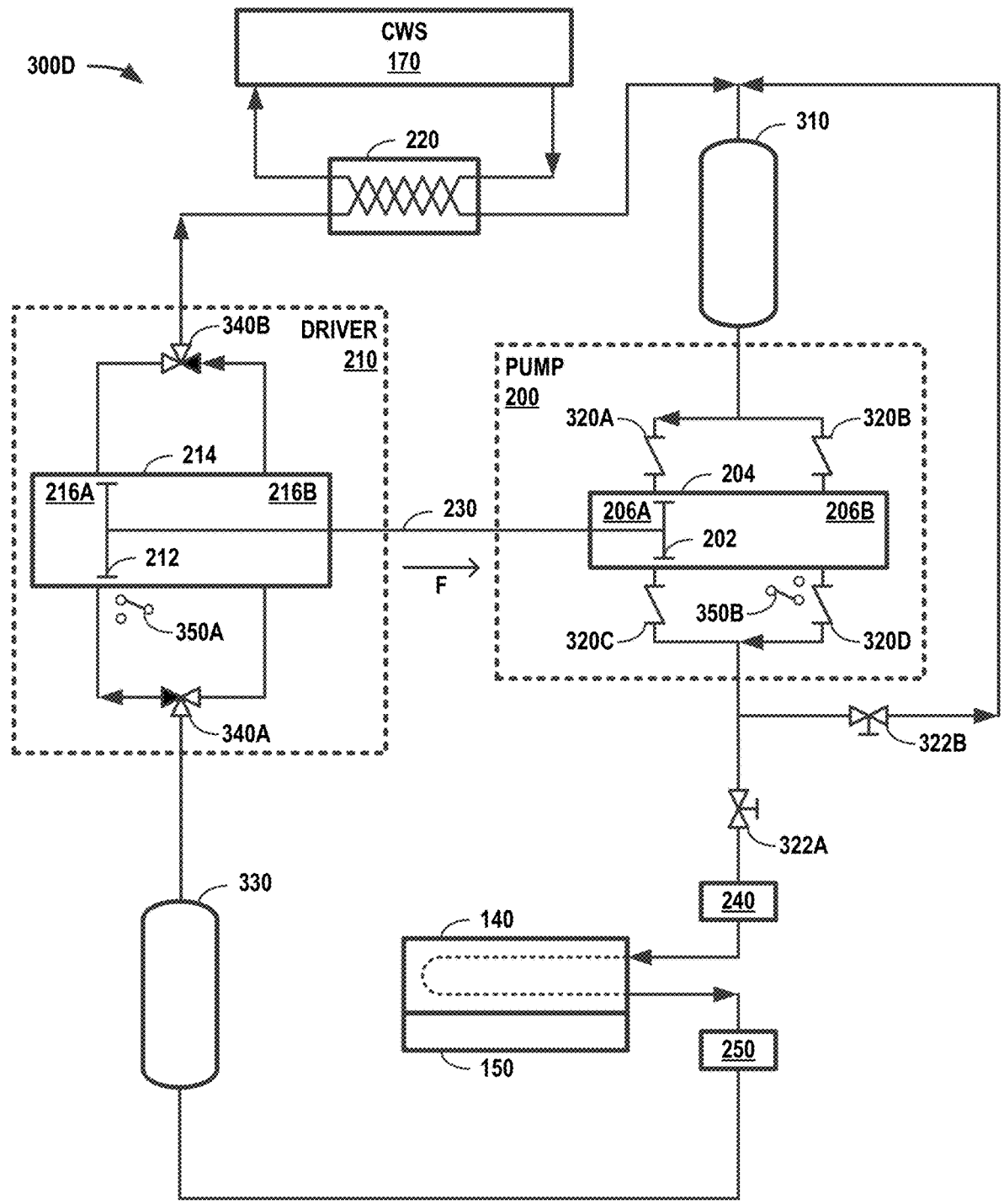
FIG. 4D is an example instrumentation diagram of the system of FIG. 3 transitioning from the second state B to the first state A, in accordance with techniques described herein.

FIG. 4D is an example instrumentation diagram of the system 300D of FIG. 3 transitioning from the second state B to the first state A. Piston 212 may move to a position that causes switch 350A to move to a "closed" position. The "closed" position of switch 350A may be associated with state A. The "closed" position of switch 350A may cause driver inlet valve 340A and driver outlet valve 340B to be "energized". Once energized, driver inlet valve 340A may direct gaseous refrigerant into chamber 216A while driver outlet valve 340B may direct gaseous refrigerant out of chamber 216B, as described in FIG. 4A.

Figure 5:
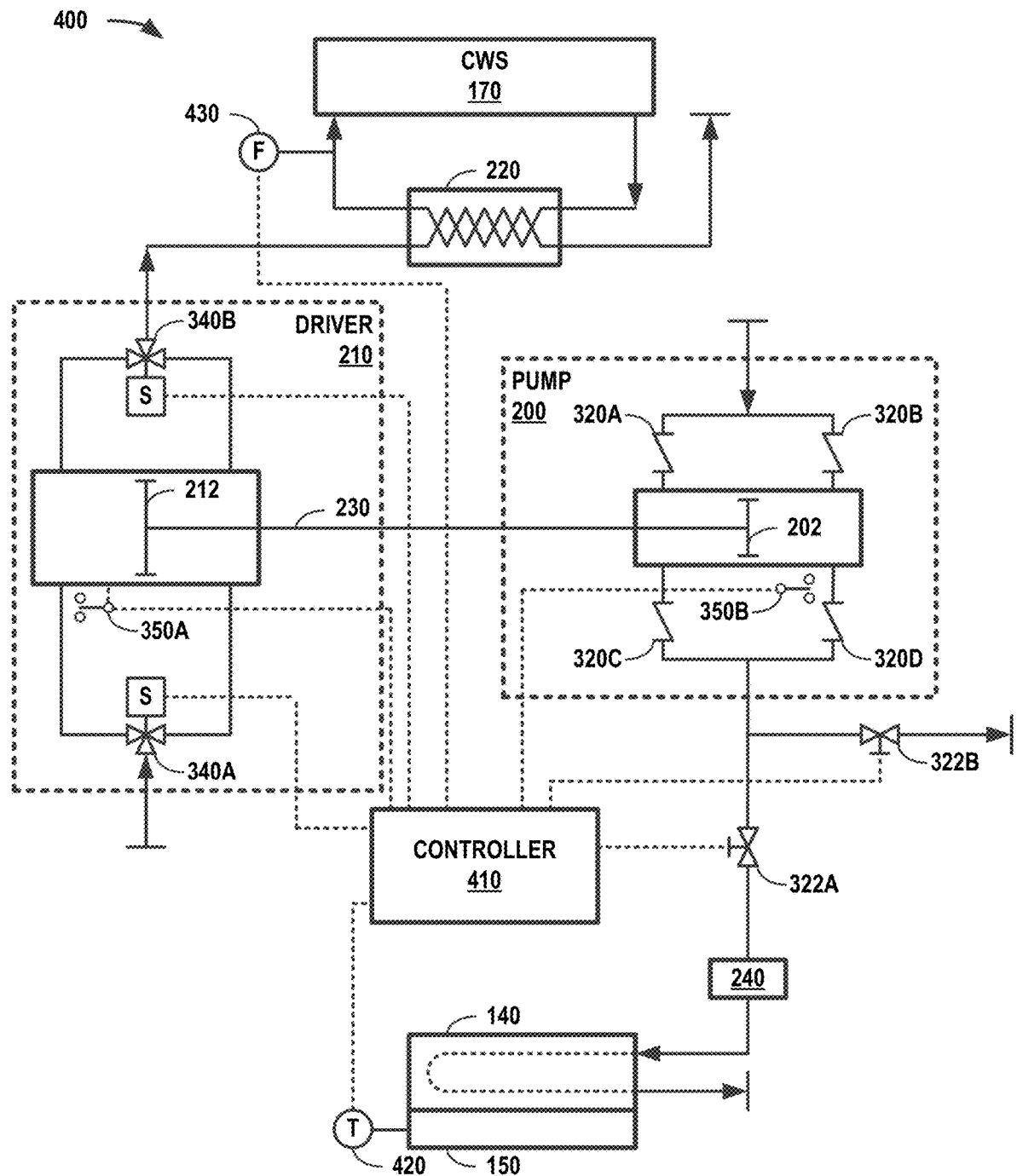
FIG. 5 is an example instrumentation diagram of a control system for the system of FIG. 3, in accordance with techniques described herein.

FIG. 5 is a diagram illustrating an example control system for particular components of FIG. 3. Control system 400 may include a controller 410 that is communicatively coupled to one or more components of a refrigeration system, such as refrigeration system 300 of FIG. 3.

Control system 400 may include controller 410. Controller 410 may be configured to receive signals and/or information from instrumentation and actuators in refrigeration system 100, as will be described below. Examples of controller 410 may include any one or more of a microprocessor, controller, digital signal processor (DSP), application specific integrated circuit (ASIC), field-programmable gate array (FPGA), or equivalent discrete or integrated logic circuitry. In some examples, controller 410 includes relays, power supplies, and data acquisition modules.

In some examples, controller 410 may be configured to direct components of driver 210 and/or pump 200, to create an alternating mechanical force. Controller 410 may be communicatively coupled to driver inlet valve 340A and driver outlet valve 340B. Driver valves 340 may each have circuitry that corresponds to a first state and a second state. In some examples, controller 410 may include switch circuitry configured to energize and deenergize driver valves 340 based on a position of a moveable driver barrier, a moveable pump barrier, mechanical link 230, or other component that changes position in conjunction with the mechanical force. The position of the moveable driver barrier or moveable pump barrier may indicate that a positional limit has been reached and that the mechanical force may be reversed. In other examples, other indicators for a limit may be used to trigger reversal of the mechanical force, such as a pressure limit, timing limit, flow limit, or the like. In the example of FIG. 5, each of driver valves 340 has a solenoid that has an energized and a deenergized state corresponding to a first position of the pistons 202, 212 and a second position of pistons 202, 212, respectively. Driver inlet valve 340A may be configured to supply gaseous refrigerant to driver chamber 216A in response to being energized and supply gaseous refrigerant to driver chamber 216B in response to being deenergized. Driver outlet valve 340B may be configured to discharge gaseous refrigerant from driver chamber 216B in response to being energized and discharge gaseous refrigerant from driver chamber 216A in response to being deenergized.

Controller 410 may be communicatively coupled to switches 350. Controller 410 may be configured to receive a status signal from each of switches 350 as to an "open" or "closed" state. In some examples, controller 410 may include relays that receive status from switches 350 as inputs for control of driver valves 330.

As an example, for a change in state from state A to state B discussed in FIGS. 4A and 4B above, controller 410 may receive a status from switch 350A indicating that piston 212 has reached a positional limit. In response to receiving the status, controller 410 may send a signal to a solenoid of driver inlet valve 340A and a solenoid of driver outlet valve 340B to energize, causing gaseous refrigerant to enter chamber 216A and causing gaseous refrigerant to exit 216B.

In some examples, controller 410 may be configured to monitor operating conditions of refrigeration system 100 and adjust parameters of refrigeration system 100 to control the operating conditions within particular limits. Controller 410 may be communicatively coupled to a temperature sensor 420. Temperature sensor 420 may be thermally coupled to CPU 150. Controller 410 may be configured to receive temperature signals from temperature sensor 420. Controller 410 may be communicatively coupled to flow regulating valves 322. For example, controller 410 may be configured to receive temperature signals from a thermocouple at an outlet of HEX 140 and send signals to an actuator on flow regulating valves 322 to adjust the actuator and, correspondingly, increase or decrease a flow rate of refrigerant to HEX 140 in response to the temperature of the outlet of HEX 140. Controller 410 may be communicatively coupled to a flow meter 430 on an inlet or outlet of condenser 220. Controller 410 may be configured to receive flow rate information and increase flow rate of cooling water to control a temperature of the refrigerant or temperature of cooling water return.

As an example, controller 410 may receive a temperature signal from temperature sensor 420 indicating that a temperature of CPU 150 is increasing. Controller 410 may send an actuator signal to flow regulating valves 322 to increase a refrigerant flow rate and decrease a recycle flow rate. Additionally, or alternatively, controller 410 may increase a cooling water flow rate from CWS 170 to lower a refrigerant temperature.

In some examples, the techniques described above for powering transportation of refrigerant may be used to recover heat from power generation systems and convert the recovered heat into work for powering one or more thermodynamic cycles. These heat recovery and cooling systems may replace or supplement cooling water systems to cool heat loads in a data center. For example, power generation systems located on-site of a data center may generate flue gas or other hot air stream. Rather than discharge this hot air stream directly into the atmosphere, systems described in FIGS. 9A-11C may use a coolant (or "refrigerant") flowing through a heat exchanger to remove heat from the hot air stream and exit the heat exchanger as gaseous coolant. As described above, a driver uses the gaseous coolant to create a mechanical force used to power the pump circulating the coolant. In addition to driving the pump in the same thermodynamic cycle, the driver may drive a compressor in another thermodynamic cycle. This compressor pressurizes gaseous coolant in the other thermodynamic cycle. The gaseous refrigerant is condensed and circulated to an evaporator to remove heat from another fluid stream. For example, the other fluid stream may be similar to the refrigeration cycle described in FIGS. 1-5 above, with the condenser and cooling water system replaced with the evaporator and thermodynamic cycles described above. This evaporator may be a flooded evaporator that may provide a relatively high operating efficiency and corresponding low power input. The cooling system may use a reduced amount of power, as the driver may both pump and compress coolant with reduced electricity or gas, and may be capable of operating with relatively low global warming potential (GWP) coolants and with reduced or no cooling water for condensing the coolant.

Figure 9A:
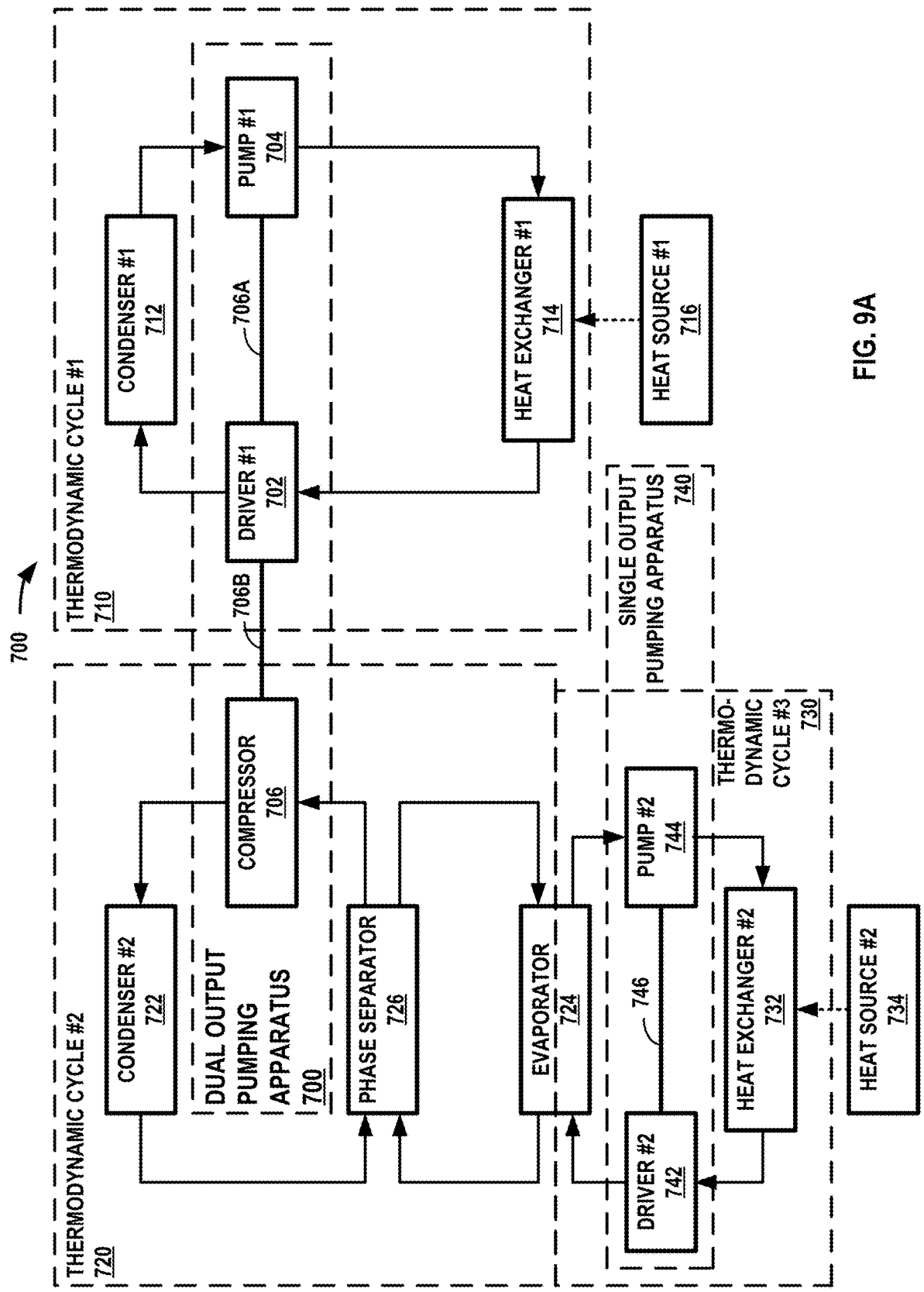
FIG. 9A is a block diagram illustrating a high-level view of an example energy harvesting and cooling system, in accordance with techniques described herein.

FIG. 9A is a block diagram illustrating a high-level view of an example energy harvesting and cooling system, in accordance with techniques described herein. A system includes a first thermodynamic cycle 710 and a second thermodynamic cycle 720. First thermodynamic cycle 710 and second thermodynamic cycle 720 are driven by a dual-output pumping apparatus 700. Apparatus 700 includes a driver 702, a pump 704 mechanically coupled to driver 702, and a compressor 706 mechanically coupled to driver 702. Apparatus 700 may be similar to the pumps and driver described in FIGS. 1-5 above, except that apparatus 700 may be configured to further drive compressor 706.

Driver 702 includes a first driver chamber and a second driver chamber separated by a moveable driver barrier coupled to a mechanical link 706A and 706B. Driver 702 is configured to alternately expand and contract the first and second driver chambers in response to an alternating pressure differential of a gaseous first coolant between a first pressure and a second pressure of the first and second driver chambers. Driver 702 is configured to produce a mechanical force from the alternating pressure differential. In some examples, driver 702 is configured to receive the gaseous first coolant at the first pressure and discharge the gaseous first coolant at the second pressure.

In some examples, driver 702 further includes a 3-way inlet valve and a 3-way outlet valve each fluidically coupled to each of the first and second driver chambers, such as described with respect to driver 214 of FIG. 3. For example, driver 702 may be configured to create the alternating pressure differential across the moveable driver barrier by alternately supplying the gaseous first coolant at the first pressure to one of the first and second driver chambers using the 3-way inlet valve and discharging the gaseous first coolant at the second pressure from the other of the first and second driver chambers using the 3-way outlet valve. In some examples, apparatus 700 includes a controller communicatively coupled to driver 702. The controller includes switch circuitry configured to energize or deenergize the 3-way inlet and outlet valves based on a position of the moveable driver barrier in the driver. In some examples, the switch circuitry includes a first switch adjacent the first driver chamber and a second switch adjacent one of the second driver chamber, the second pump chamber, or the second compressor chamber. The first switch is configured to close when the moveable driver barrier is positioned near the first switch and energize the 3-way inlet and outlet valves. The second switch is configured to close when the moveable driver barrier, the moveable pump barrier, or the moveable compressor barrier is positioned near the second switch and deenergize the 3-way inlet and outlet valves. The 3-way inlet valve is configured to supply the gaseous first coolant to the first driver chamber in response to being energized and the second driver chamber in response to being deenergized. The 3-way outlet valve is configured to discharge the gaseous first coolant from the second driver chamber in response to being energized and the first driver chamber in response to being deenergized.

Pump 704 is configured to pump a liquid first coolant in response to the mechanical force from driver 702. In some examples, pump 704 includes a first pump chamber and a second pump chamber separated by a moveable pump barrier coupled to mechanical link 706A and configured to alternately expand and contract the first and second pump chambers in response to the mechanical force. In some examples, pump 704 is configured to receive the liquid first coolant at a third pressure and discharge the liquid first coolant at a fourth pressure.

Compressor 706 is configured to compress a second coolant in response to the mechanical force from driver 702. In some examples, compressor 706 includes a first compressor chamber and a second compressor chamber separated by a moveable compressor barrier coupled to mechanical link 706B and configured to alternately expand and contract the first and second compressor chambers in response to the mechanical force. In some examples, compressor 706 is configured to receive the second coolant at a fifth pressure and discharge the second coolant at a sixth pressure. In some examples, a surface area of the moveable pump barrier is different than a surface area of the moveable compressor barrier. For example, a ratio of a surface area of the moveable driver barrier to each of the moveable pump barrier and the moveable compressor barrier may correspond to an amount of pumping or compressing power of the respective pump 704 or compressor 706.

Figure 7:
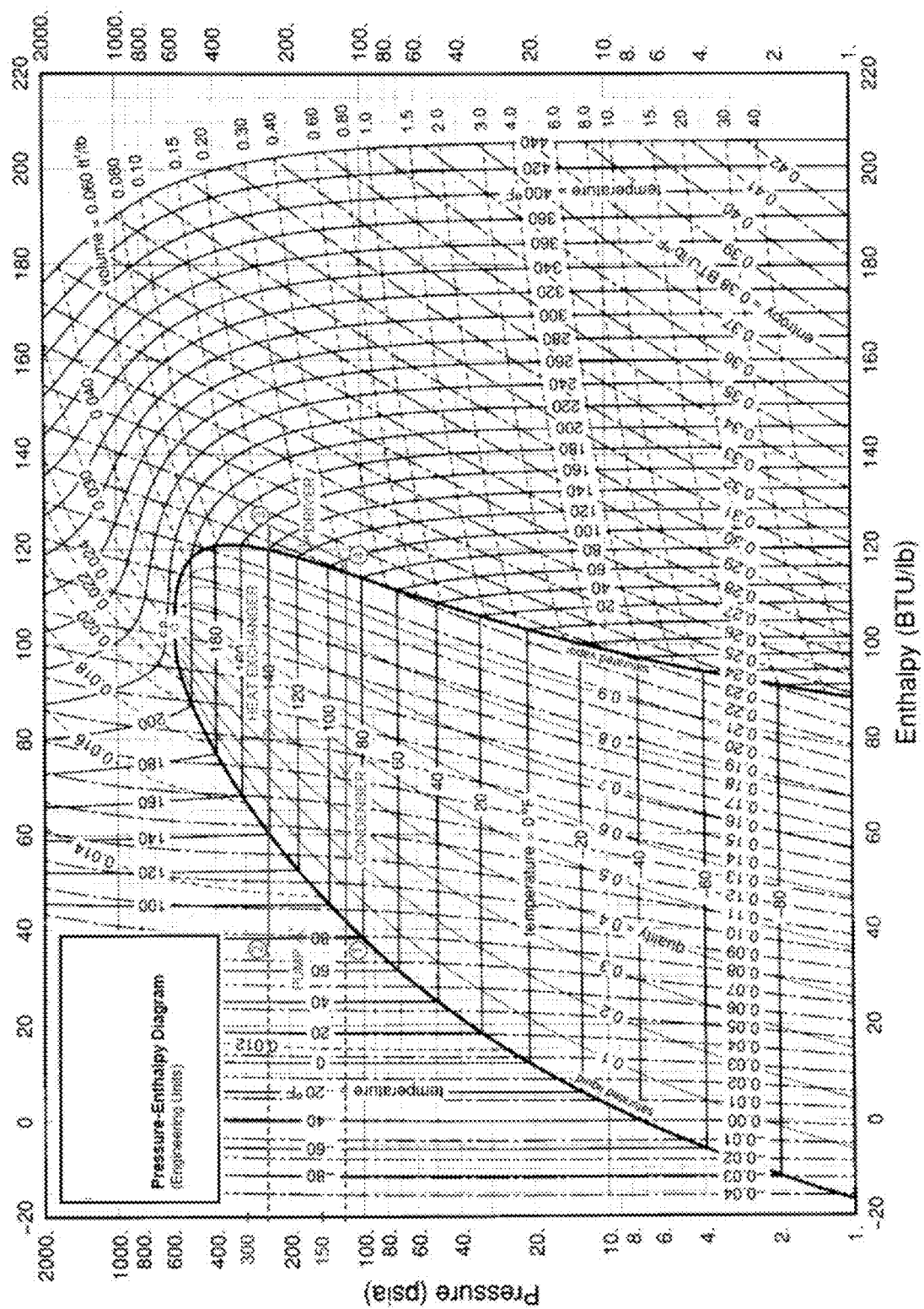
FIG. 7 is an exemplary pressure-enthalpy diagram for a refrigerant in a refrigerant system, in accordance with techniques described herein.

The system of FIG. 7 includes a first thermodynamic cycle 710 driven by pump 704. First thermodynamic cycle 710 is configured to remove heat from a first fluid stream using a first coolant. In some examples, the first fluid stream includes a hot gas stream from a power generation system. In the example of FIG. 9A, first thermodynamic cycle 710 includes a first condenser 712 configured to condense the first coolant and one or more heat exchangers 714 configured to remove heat from the first fluid stream using the first coolant. The first fluid stream may include any fluid stream produced by a heat source 716. Heat source 716 may include any waste heat generating system, such as a power generation system. In some examples, heat source 716 includes a power generation system of a data center.

The system of FIG. 7 also includes a second thermodynamic cycle 720 driven by compressor 706. Second thermodynamic cycle 720 is configured to remove heat from a second fluid stream using a second coolant. In the example of FIG. 9A, second thermodynamic cycle 720 includes a second condenser 722 configured to condense the second coolant and an evaporator 724 configured to remove heat from the second fluid stream using the second coolant.

In the example of FIG. 9A, evaporator 724 is a flooded evaporator. Rather than use a direct expansion evaporator, the flooded evaporator of evaporator 724 may operate in conjunction with a phase separator 726. Phase separator 726 may be a relatively low pressure receiver that separates gaseous and liquid second coolant, such as downstream of an expansion valve, and ensures a feed of substantially liquid coolant to evaporator 724. In contrast with a direct expansion evaporator, the coolant in a flooded evaporator may not be fully evaporated and superheated at an outlet of the flooded evaporator. Rather, the discharged coolant flow may a two-phase mixture, such as 50-80% gas by mass flow rate. In some examples, phase separator 726 may be configured to separate phases while phase separator 726 is in motion. For example, the system of FIG. 9A may be a mobile system configured to operate while in motion. To separate phases of second coolant during motion, phase separator 726 may include structures, such as baffles, configured to reduce or prevent liquid second coolant from being discharged into compressor 706 and/or gaseous second coolant from being discharged into evaporator 724.

Figure 9B:
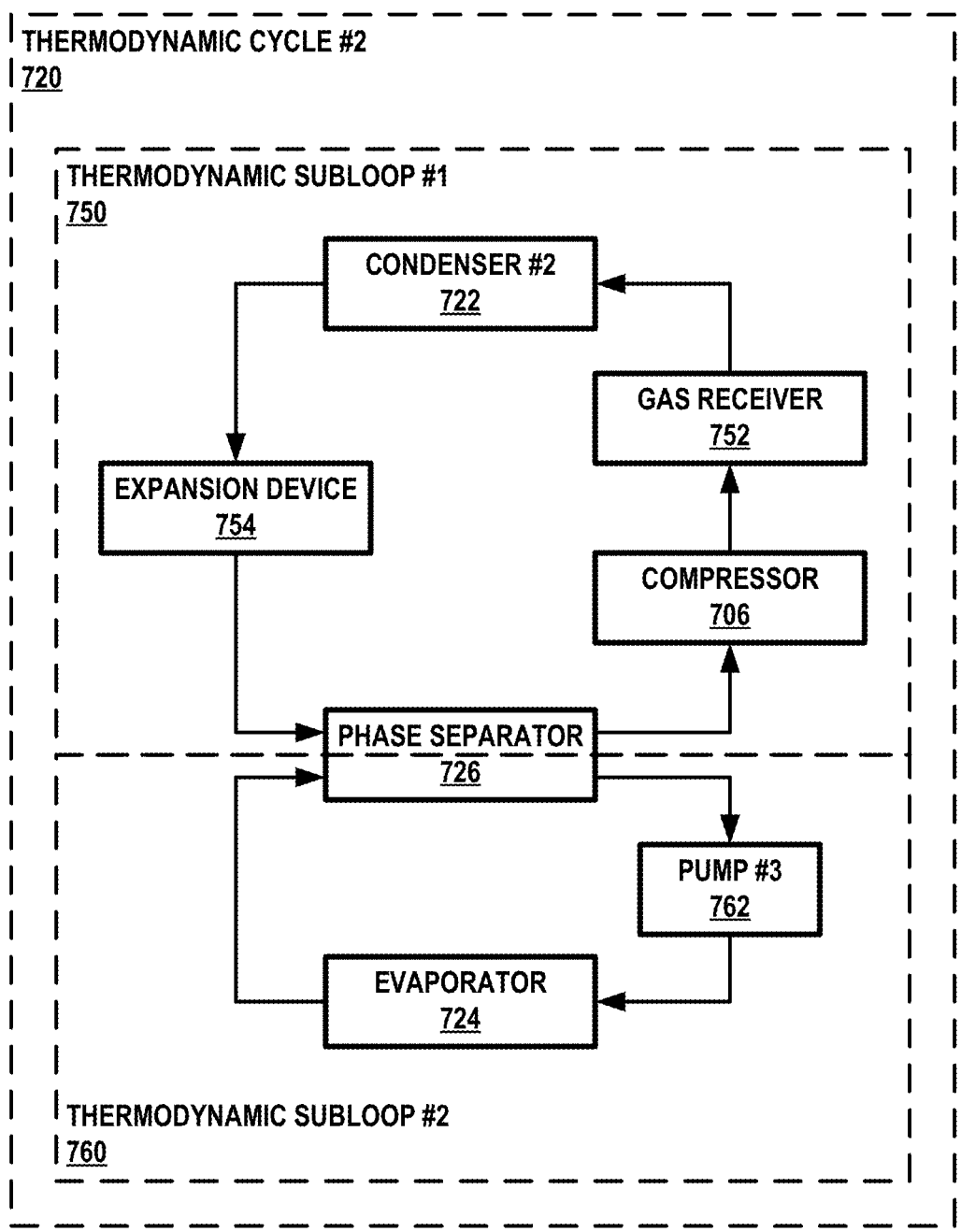
FIG. 9B is a block diagram illustrating a high-level view of a second thermodynamic cycle of FIG. 9A, in accordance with techniques described herein.

FIG. 9B is a block diagram illustrating a high-level view of second thermodynamic cycle 720 of FIG. 9A that includes a flooded evaporator, in accordance with techniques described herein. In the example of FIG. 9B, second thermodynamic cycle 720 includes a first thermodynamic subloop 750 and a second thermodynamic subloop 760.

First thermodynamic subloop 750 is configured to circulate the second coolant from phase separator 726 to second condenser 722 using compressor 706. Compressor 706 may be configured to pressurize gaseous second coolant and discharge pressurized gaseous second coolant to second condenser 722, optionally via a gas receiver 752. Second condenser may be configured to condense gaseous second coolant to subcooled liquid second coolant and discharge the subcooled liquid second coolant to an expansion device 754. Expansion device 754 may be configured to expand the subcooled liquid second coolant to reduce the temperature of the second coolant. In some examples, expansion device 754 may include an expansion valve, an expansion orifice, or any other expansion device configured to reduce a pressure of the second coolant. In some examples, expansion device 754 may not require a regulating action, as flooded evaporator 724 may be self-regulating. The resulting second coolant discharged from expansion device 754 includes at least a portion of gaseous second coolant. The second coolant may be discharged to phase separator 726 to separate gaseous second coolant and liquid second coolant from expansion device 754.

Second thermodynamic subloop 760 is configured to circulate second coolant from phase separator 726 to evaporator 724. In the example of FIG. 9B, second thermodynamic subloop 760 operates evaporator 724 as a forced-flow evaporator, and includes a pump 762 (or other flow generating device, such as an ejector) configured to pump second coolant between phase separator 726 and evaporator 724. However, in other examples, second thermodynamic subloop 760 may operate evaporator 724 as a thermosiphon evaporator without pump 762, such that a density difference between liquid coolant and gaseous coolant may drive flow of coolant between phase separator 726 and evaporator 724. Evaporator 724 may be configured to receive subcooled liquid second coolant from phase separator 726 and remove heat from a second fluid stream. The removed heat may evaporate a portion of the second coolant, such that evaporator 724 may discharge a two-phase second coolant to phase separator 726, depending on a heat load of evaporator 724.

In operation, beginning at phase separator 726, second coolant from phase separator 726 may enter evaporator 724 and evaporate due to the heat transferred from a secondary side. The second coolant at an inlet of evaporator 724 may be slightly sub-cooled due to a pressure increase from gas separator 726 to evaporator 724, such as due to pump 762. After evaporator 724, the two-phase second coolant mixture again enters phase separator 726, where liquid and gaseous second coolant are separated. The gaseous second coolant then enters compressor 706, while the remaining liquid second coolant is re-circulated through evaporator 724. The gaseous second coolant is compressed in compressor 706 and condensed in second condenser 722. The spontaneous vaporization in the receiver ensures that no liquid enters the compressor. In some instances, a force driving the second coolant through evaporator 724 may depend on a density difference between gaseous and liquid coolant. When refrigerant is evaporated inside evaporator 724, a lower density of gaseous second refrigerant may allow more liquid refrigerant to flow inside evaporator 724.

Referring back to FIG. 9A, the second fluid stream cooled by evaporator 724 may be any of a variety of fluid streams. For example, second thermodynamic cycle 720 may operate as a large conversion cycle for providing cooling to one or more additional thermodynamic cycles that my cool smaller systems and/or provide greater independent control for particular cooling systems. In some examples, the second fluid stream includes a third thermodynamic cycle 730 fluidically coupled to evaporator 724. Third thermodynamic cycle 730 is configured to remove heat from one or more heat sources using a third coolant. In the example of FIG. 9A, third thermodynamic cycle 730 includes one or more heat exchangers 732 configured to remove heat from a heat source 734 using the third coolant. Heat source 734 may include any heat source in an industrial or commercial environment for which a thermodynamic cycle may provide cooling. In some examples, one or more heat exchangers 732 include one or more microchannel heat exchangers configured to remove heat generated by at least one computer processor executing within a data center, such as microchannel heat exchangers 140 described in FIGS. 1-5.

In some examples, third thermodynamic cycle 730 includes a single output pumping apparatus 740 configured to pump the third coolant from evaporator 724 to one or more heat exchangers 732, such as may be similar to the refrigeration cycles powered by a pump and driver that are described in FIG. 1-5. For example, pumping apparatus 740 may include a second driver 742 that includes a first driver chamber and a second driver chamber separated by a moveable driver barrier coupled to a mechanical link 746. Second driver 742 is configured to alternately expand and contract the first and second driver chambers in response to an alternating pressure differential of a gaseous third coolant between a first pressure and a second pressure of the first and second driver chambers. Second driver 742 is configured to produce a mechanical force from the alternating pressure differential. Pumping apparatus 740 includes a pump 744 mechanically coupled to second driver 742. Pump 744 is configured to pump a liquid third coolant in response to the mechanical force from second driver 742.

In some examples, rather than using single output pumping apparatus 740, third thermodynamic cycle may include another device or system configured to pump the third coolant and expand the third coolant. For example, thermodynamic cycle 730 may include an electric pump configured to pump the third coolant to the one or more heat exchanger 732 and an expansion device configured to expand the third coolant and discharge the third coolant to evaporator 724.

The heat recovery and cooling system of FIG. 9A may be configured for a relatively low environmental impact. In some examples, thermodynamic cycles 710, 720, 730 may be configured to operate using relatively environmentally benign coolants. For example, any of the first coolant of first thermodynamic cycle 710, the second coolant of second thermodynamic cycle 720, and/or the third coolant of third thermodynamic cycle 730 may have a global warming potential less than 5. In some examples, thermodynamic cycles 710, 720, 730 may be configured to operate using relatively low or negligible quantities of cooling water. For example, either of condensers 712, 722 may include a dry chiller, dry cooler, or other heat exchanger configured to cool a coolant with low or no cooling water source. In some examples, at least one of first condenser 712 and second condenser 722 includes at least one of a dry cooler, a dry chiller, or a wet tower, while in other examples, each of first condenser 712 and second condenser 722 includes at least one of a dry cooler, a dry chiller, or a wet tower.

Figure 9C:
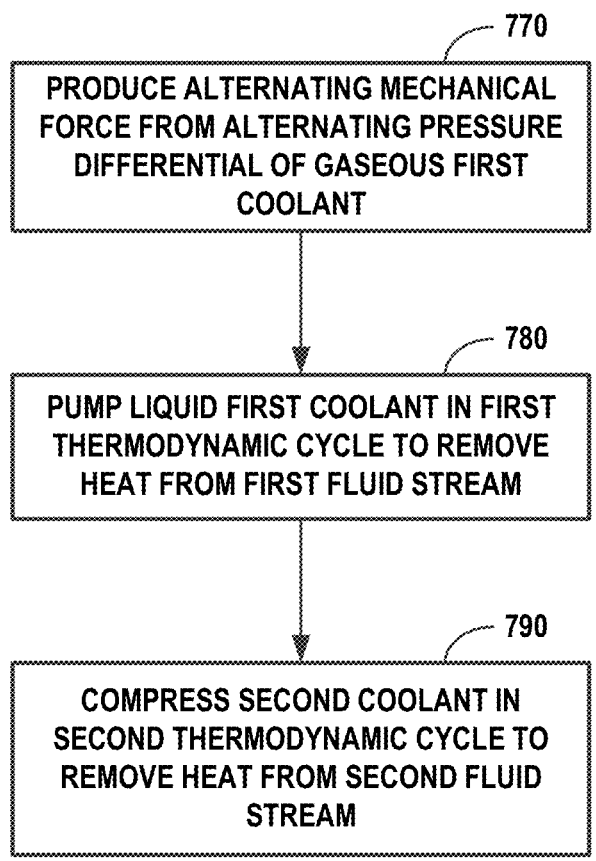
FIG. 9C is an example flow diagram of a process for removing heat from first and second fluid streams using the system of FIG. 9A, in accordance with techniques described herein.

In operation, the system may be configured to recover heat from heat sources and power thermodynamic cycles 710, 720, 730 using the recovered heat. FIG. 9C is an example flow diagram of a process for removing heat from first and second fluid streams using the system of FIG. 9A, in accordance with techniques described herein. A method for operating the system includes producing, by driver 702 of pumping apparatus 700, an alternating mechanical force from an alternating pressure differential of a gaseous first coolant (770). In response to the alternating mechanical force from driver 702, the method includes pumping, by pump 704 of pumping apparatus 700, the liquid first coolant in first thermodynamic cycle 710 to remove heat from a first fluid stream (780). In response to the alternating mechanical force from driver 702, the method includes compressing, by compressor 706 of pumping apparatus 700, a second coolant in second thermodynamic cycle 720 to remove heat from a second fluid stream (790).

The techniques described herein may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such as a processor or an integrated circuit device, such as an integrated circuit chip or chipset. Alternatively or additionally, if implemented in software or firmware, the techniques may be realized at least in part by a computer-readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as random access memory (RAM), read-only memory (ROM), non-volatile random access memory (NVRAM), electrically erasable programmable read-only memory (EEPROM), Flash memory, magnetic or optical data storage media, and the like. In some examples, an article of manufacture may comprise one or more computer-readable storage media.

In some examples, the computer-readable storage media may comprise non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (D S P s), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

Select examples of the present disclosure include, but are not limited to, the following:

Example 1: An apparatus includes a driver comprising a first driver chamber and a second driver chamber separated by a moveable driver barrier coupled to a mechanical link, wherein the driver is configured to: alternately expand and contract the first and second driver chambers in response to an alternating pressure differential of a gaseous first coolant between a first pressure and a second pressure of the first and second driver chambers, respectively; and produce a mechanical force from the alternating pressure differential; a pump mechanically coupled to the driver, wherein the pump is configured to pump a liquid first coolant in response to the mechanical force from the driver; and a compressor mechanically coupled to the driver, wherein the compressor is configured to compress a second coolant in response to the mechanical force produced by the driver.

Example 2: The apparatus of example 1, wherein the pump includes a first pump chamber and a second pump chamber separated by a moveable pump barrier coupled to the mechanical link and configured to alternately expand and contract the first and second pump chambers in response to the mechanical force, and wherein the compressor includes a first compressor chamber and a second compressor chamber separated by a moveable compressor barrier coupled to the mechanical link and configured to alternately expand and contract the first and second compressor chambers in response to the mechanical force.

Example 3: The apparatus of example 2, wherein a surface area of the moveable pump barrier is different than a surface area of the moveable compressor barrier.

Example 4: The apparatus of any of examples 1 through 3, wherein the driver is configured to receive the gaseous first coolant at the first pressure and discharge the gaseous first coolant at the second pressure, wherein the pump is configured to receive the liquid first coolant at a third pressure and discharge the liquid first coolant at a fourth pressure, and wherein the compressor is configured to receive the second coolant at a fifth pressure and discharge the second coolant at a sixth pressure.

Example 5: The apparatus of any of examples 2 through 4, wherein the driver further comprises a 3-way inlet valve and a 3-way outlet valve each fluidically coupled to each of the first and second driver chambers, and wherein the driver is configured to create the alternating pressure differential across the moveable driver barrier by alternately supplying the gaseous first coolant at the first pressure to one of the first and second driver chambers using the 3-way inlet valve and discharging the gaseous first coolant at the second pressure from the other of the first and second driver chambers using the 3-way outlet valve.

Example 6: The apparatus of example 5, further comprising a controller communicatively coupled to the driver, wherein the controller includes switch circuitry configured to energize or deenergize the 3-way inlet valve and the 3-way outlet valve based on a position of the moveable driver barrier in the driver.

Example 7: The apparatus of example 6, wherein the switch circuitry comprises a first switch adjacent the first driver chamber and a second switch adjacent one of the second driver chamber or the second pump chamber, wherein the first switch is configured to close when the moveable driver barrier is positioned near the first switch and energize the 3-way inlet valve and the 3-way outlet valve, wherein the second switch is configured to close when the moveable driver barrier or the moveable pump barrier is positioned near the second switch and deenergize the 3-way inlet valve and the 3-way outlet valve, wherein the 3-way inlet valve is configured to supply the gaseous first coolant to the first driver chamber in response to being energized and the second driver chamber in response to being deenergized, and wherein the 3-way outlet valve is configured to discharge the gaseous first coolant from the second driver chamber in response to being energized and the first driver chamber in response to being deenergized.

Example 8: A system includes a pumping apparatus includes a driver comprising a first driver chamber and a second driver chamber separated by a moveable driver barrier coupled to a mechanical link, wherein the driver is configured to: alternately expand and contract the first and second driver chambers in response to an alternating pressure differential of a gaseous first coolant between a first pressure and a second pressure of the first and second driver chambers; and produce a mechanical force from the alternating pressure differential; a pump mechanically coupled to the driver, wherein the pump is configured to pump a liquid first coolant in response to the mechanical force from the driver; and a compressor mechanically coupled to the driver, wherein the compressor is configured to pressurize a second coolant in response to the mechanical force from the driver; a first thermodynamic cycle driven by the pump, wherein the first thermodynamic cycle is configured to remove heat from a first fluid stream using the first coolant; and a second thermodynamic cycle driven by the compressor, wherein the second thermodynamic cycle is configured to remove heat from a second fluid stream using the second coolant.

Example 9: The system of example 8, wherein the first fluid stream comprises a hot gas stream from a waste heat generating system.

Example 10: The system of any of examples 8 and 9, wherein the first thermodynamic cycle comprises: a first condenser configured to condense the first coolant; and one or more heat exchangers configured to remove heat from the first fluid stream using the first coolant; and wherein the second thermodynamic cycle comprises: a second condenser configured to condense the second coolant; and an evaporator configured to remove heat from the second fluid stream using the second coolant.

Example 11: The system of example 10, wherein at least one of the first condenser and the second condenser comprises at least one of a dry chiller, a dry cooler, a condensing system, or a wet tower.

Example 12: The system of any of examples 10 and 11, wherein each of the first condenser and the second condenser comprises at least one of a dry chiller, a dry cooler, a condensing system, or a wet tower.

Example 13: The system of any of examples 10 through 12, wherein the evaporator comprises a flooded evaporator for the second fluid stream.

Example 14: The system of example 13, wherein the second thermodynamic cycle comprises: a phase separator configured to separate gaseous and liquid second coolant; a first thermodynamic subloop configured to circulate the second coolant from the phase separator to the second condenser using the compressor; and a second thermodynamic subloop configured to circulate the second coolant from the phase separator to the evaporator.

Example 15: The system of any of examples 10 through 14, wherein the second fluid stream comprises a third cooling loop configured to remove heat from one or more heat sources using a third coolant.

Example 16: The system of example 15, further comprising the third cooling loop fluidically coupled to the evaporator, wherein the third cooling loop comprises: one or more heat exchangers configured to remove heat from the heat source using the third coolant; and a second pumping apparatus configured to pump the third coolant from the evaporator to the one or more heat exchangers.

Example 17: The system of example 16, wherein the one or more heat exchangers comprise one or more microchannel heat exchangers configured to remove heat generated by at least one computer processor executing within a data center.

Example 18: The system of any of examples 16 and 17, wherein the second pumping apparatus comprises: a second driver comprising a third driver chamber and a fourth driver chamber separated by a second moveable driver barrier coupled to a second mechanical link, wherein the second driver is configured to: alternately expand and contract the third and fourth driver chambers in response to an alternating pressure differential of a gaseous third coolant between a third pressure and a fourth pressure of the third and fourth driver chambers; and produce a mechanical force from the alternating pressure differential; a fourth pump mechanically coupled to the second driver, wherein the fourth pump is configured to pump a liquid third coolant in response to the mechanical force from the second driver.

Example 19: The system of any of examples 8 through 18, wherein the first coolant and the second coolant have a global warming potential less than 5.

Example 20: A method includes producing, by a driver of a pumping apparatus, an alternating mechanical force from an alternating pressure differential of a gaseous first coolant, wherein the driver comprises a first driver chamber and a second driver chamber separated by a moveable driver barrier coupled to a mechanical link, and wherein the first and second driver chambers alternately expand and contract in response to the alternating pressure differential of the gaseous first coolant between the first and second driver chambers; pumping, by a pump of the pumping apparatus and in response to the alternating mechanical force from the driver, a liquid first coolant in a first thermodynamic cycle to remove heat from a first fluid stream; and compressing, by a compressor of the pumping apparatus and in response to the alternating mechanical force from the driver, a second coolant in a second thermodynamic cycle to remove heat from a second fluid stream.

EXAMPLES

Example 1

A simulation was performed on a refrigeration system, such as the refrigeration system of FIG. 3. Reference will be made to FIG. 7, which is a diagram of a pressure-enthalpy diagram for a refrigerant. In this example, HFC-134a was used.

Pumping: Subcooled liquid is pumped between (1) and (2), which increases a pressure from 119.1 psia to 240 psia at constant temperature. The enthalpy of the liquid refrigerant increases from 38.1 BTU/lb to 38.5 BTU/lb.

CPU Cooling: CPU cooling occurs between (2) and (3). Refrigerant is heated from a subcooled liquid at 80° F. to a superheated gas at 150° F. at constant pressure. The enthalpy of the refrigerant increases from 38.5 BTU/lb to 123.3 BTU/lb.

Pump Power: For the CPU to reject 1 kW (3412 BTU/hr) of heat requires 40.24 lb/hr of refrigerant. To pump 40.24 lb/hr of liquid refrigerant at 80° F. and an efficiency of 75% would require a power of 0.0075 bhp, or 0.00559 kWh for one hour of pumping in this example.

Driver Expanding: Driver expansion occurs between (3) and (4). Gaseous refrigerant on a high-pressure side is maintained at 150° F. and 240 psia, while gaseous refrigerant on a low-pressure side is cooled and depressurized at constant entropy (isentropic) to 97° F. and 120 psia. The enthalpy of the gaseous refrigerant on the low-pressure side decreases from 123.3 BTU/lb to 117.1 BTU/lb. The resulting Carnot efficiency is 8.68%. For an available thermal energy of 0.0731 kWh, the usable thermal energy is 0.00635 kWh in this example.

Refrigerant Cooling: Refrigerant cooling occurs between (4) and (1). Gaseous refrigerant is cooled and condensed from 97° F. to 80° F. at substantially constant pressure. The enthalpy of the refrigerant decreases from 117.1 BTU/lb to 38.1 BTU/lb.

Table 1 below summarizes the refrigerant properties at state points (1)-(4) for the simulation described above.

TABLE 1

Refrigerant Properties

| State Point | T (° F.) | P (psia) | h (BTU/lb) | s (BTU/lb) | p (lb/ft$^3$) |
|---|---|---|---|---|---|
| (1) | 80 | 119.1 | 38.1 | 0.0855 | 74.75 |
| (2) | 80 | 240 | 38.5 | 0.0855 | 74.75 |
| (3) | 150 | 240 | 123.3 | 0.2227 | 5.05 |
| (4) | 97 | 120 | 117.1 | 0.2227 | 2.46 |

Example 2

Figure 8:
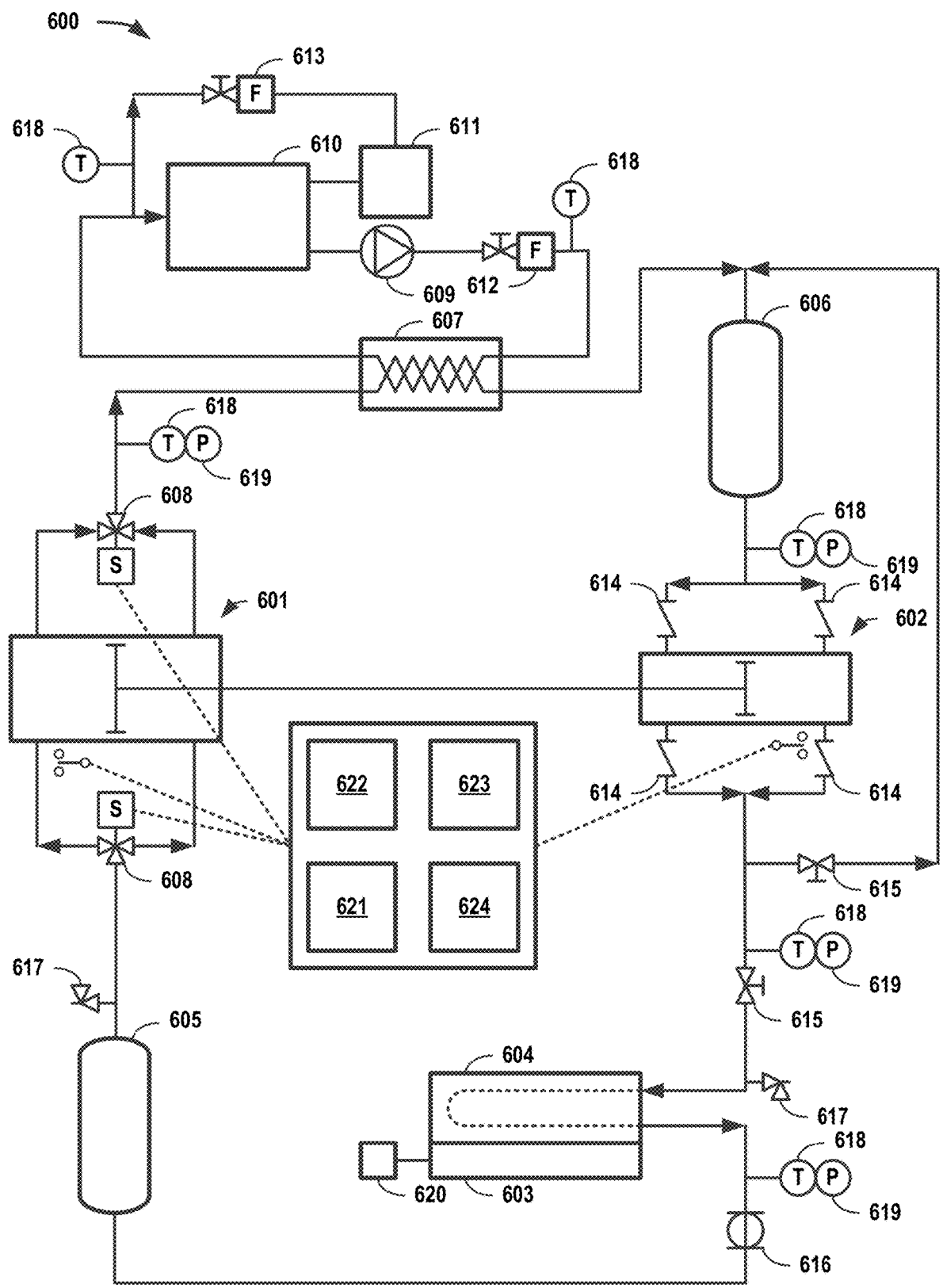
FIG. 8 is a diagram of a prototype system for removing heat from a processor.

FIG. 8 is a diagram of a prototype system for removing heat from a processor. The prototype of FIG. 8 may be similar to the refrigeration system of FIG. 3. Prototype 600 of FIG. 8 may be configured to test the refrigeration system and determine operational limits of the refrigeration system. The following components may be assembled as indicated in FIG. 8, and as in Table 2 described below.

TABLE 2

| Label | Component |
|---|---|
| 601a | Driver Cylinder: 1-1/8" Dia × 1/2" Stroke with single end switch |
| 601b | Driver Cylinder: 7/8" Dia × 1/2" Stroke with single end switch |
| 601c | Driver Cylinder: 3/4" Dia × 1/2" Stroke with single end switch |
| 602a | Pump Cylinder: 1-1/8" Dia × 1/2" Stroke with single end switch |
| 602b | Pump Cylinder: 7/8" Dia × 1/2" Stroke with single end switch |
| 602c | Pump Cylinder: 3/4" Dia × 1/2" Stroke with single end switch |
| 603 | 250 W Heater Pad, 120 V |
| 604 | Microchannel Heat Exchanger: Precision ground 6061 aluminum bar stock, 1" × 3/4" × 12" |
| 605 | Gas Accumulator: 150 cc sample cylinder |
| 606 | Liquid Receiver: 150 cc sample cylinder |
| 607 | Condenser: 1/2" × 1/4" × 10' copper tube-in-tube heat exchanger with 1/2" T × 3/8" FNPT run tees |
| 608 | Driver Supply/Exhaust 3-way Solenoid Valve |
| 609 | Condenser Water Pump: 1.52 gpm @ 20 psi |
| 610 | Condenser Water Tank: 5 gal |
| 611 | Heat Removal Ice Bath Tank: 2 gal |
| 612 | Condenser Water Flow Meter 1-12 gph rotameter w/flow control valve |
| 613 | Ice Bath Makeup Flow Meter: 0.7-7 gph rotameter w/flow control valve |
| 614 | Pump Check Valve: 1/8" NPT brass, 1 psi |
| 615 | Refrigerant Liquid Flow Control Valve: 1/8" needle valve, brass |
| 616 | Refrigerant Gas Isolation Valve: 1/4" ball valve, brass |
| 617 | Pressure Relief Valve: 3/8" NPT brass, 250 psi |
| 618 | Temperature Sensor: Type T thermocouple probe assembly w/ compression fitting |
| 619 | Pressure Transmitter: Stainless steel, 600 psia |
| 620 | Power Meter |
| 621 | Data Acquisition Module, 16 channel |
| 622 | Driver Supply/Exhaust Activating Solid State Relay |
| 623 | Driver Supply/Exhaust Deactivating Solid State Relay |
| 624 | DC Power Supply: 24VDC @ 5 A, 120VAC In |

Sub-cooled liquid refrigerant may be accumulated in the liquid receiver 606 and pumped using pump cylinder 602 and pump check valves 614 to increase refrigerant pressure. Pumping action may be achieved by a reciprocating diaphragm in pump cylinder 602 that is driven by superheated vapor at the opposite end of the refrigeration cycle.

Pressurized liquid refrigerant is distributed to a microchannel heat exchanger 604 coupled to a heater pad 603. Liquid refrigerant may pass through microchannel heat exchanger 604 and absorb heat as it evaporates. Liquid refrigerant flow control valves 615 may be used to control the superheat of the exiting vapor.

The superheated gaseous refrigerant may be collected in a gas accumulator and is used as the motive force to displace a diaphragm in driver cylinder 601. The reciprocating action of the diaphragm is effected by two 3-way solenoid valves 608 that alternately expose the driver diaphragm to hot vapor pressure.

With solenoid valves 608 de-energized, a diaphragm chamber of the driver cylinder 601 is configured such that the inlet to a first side of the diaphragm is open while the outlet is blocked, and the inlet to a second side of the diaphragm is blocked while the outlet is open. This may allow pressurized vapor to enter the first side of the diaphragm, which will expand and displace the diaphragm towards the second side and displace the gas in the second side from the previous cycle. When the diaphragm is fully displaced within the chamber, single end switches will energize the two solenoid valves 608.

When the two solenoid valves 608 are energized, the inlet to the second side of the diaphragm will not open while the outlet will close, and the inlet to the first side of the diaphragm will close while the outlet will open. This may allow pressurized vapor to enter the second side of the diaphragm which will expand and displace the diaphragm towards the first side and displace the gas in the first side from the previous cycle. When the diaphragm is fully displaced within the chamber, the single end switches will de-energize the two solenoid valves 608. The diaphragm will continue to reciprocate to create a continuously flowing refrigeration cycle.

After exiting driver cylinder 601, the hot gaseous refrigerant may enter condenser 607 to be cooled and condensed to sub-cooled liquid using water supplied from a water facility. The liquid refrigerant may be discharged into liquid receiver 606 to repeat the refrigeration cycle.

Example 3

Figure 10:
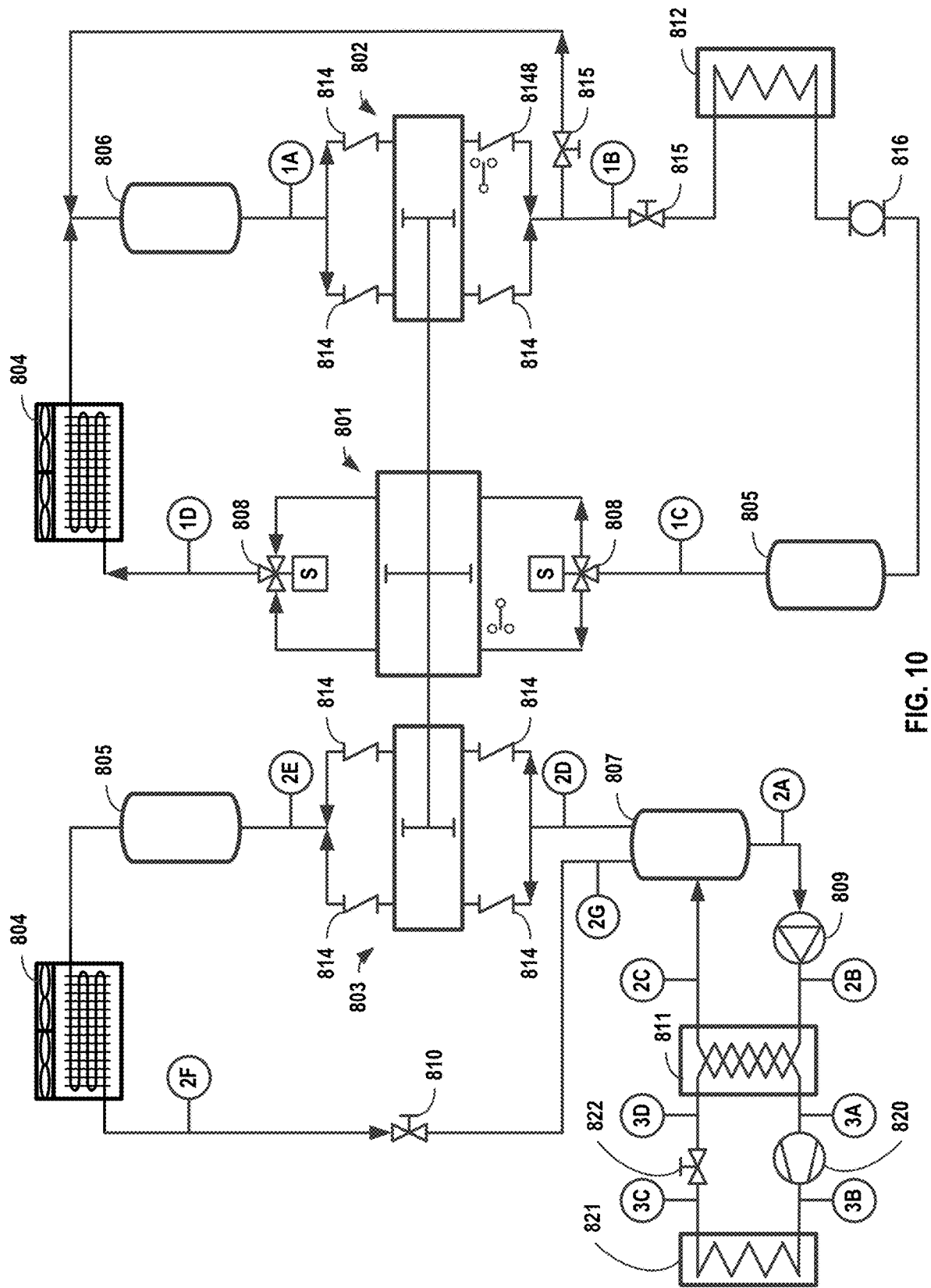
FIG. 10 is an example instrumentation diagram illustrating a component-level view of an example energy harvesting and cooling system, in accordance with techniques described herein.

FIG. 10 is an example instrumentation diagram illustrating a component-level view of an example heat recovery and cooling system, in accordance with techniques described herein. FIG. 10 includes a first thermodynamic cycle, a second thermodynamic cycle, and a third thermodynamic cycle, such as previously described by first thermodynamic cycle 710, second thermodynamic cycle 720, and third thermodynamic cycle 730 of FIG. 9A above.

Figure 11A:
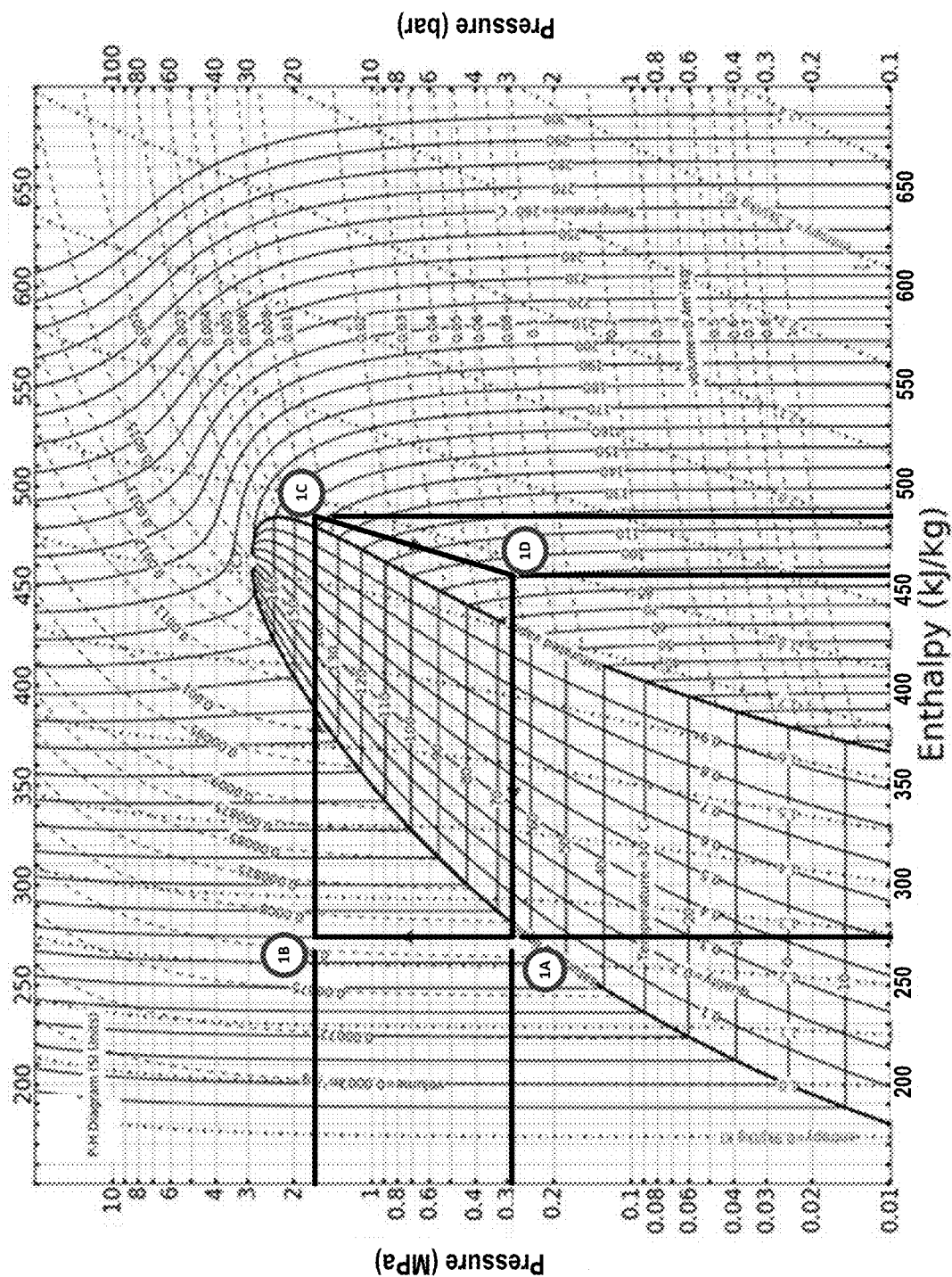
FIG. 11A is an exemplary pressure-enthalpy diagram for a coolant in the first thermodynamic cycle of FIG. 10, in accordance with techniques described herein.

A first thermodynamic cycle is configured to recover heat from a waste heat stream and convert the recovered heat to work. FIG. 11A is an exemplary pressure-enthalpy diagram for a coolant in the first thermodynamic cycle of FIG. 10, in accordance with techniques described herein.

Subcooled liquid coolant is pumped between state points (1A) and (1B), which increases a pressure of the liquid coolant at constant temperature. Subcooled liquid coolant may be accumulated in a liquid receiver 806 and pumped using pump cylinder 802 and pump check valves 814 to increase coolant pressure. Pumping action may be achieved by a reciprocating diaphragm in pump cylinder 802 that is driven by superheated vapor in a driver cylinder 801 at the opposite end of the refrigeration cycle.

Heat recovery occurs between state points (1B) and (1C). A flue gas stream heats the coolant from a subcooled liquid to a superheated gas at constant pressure. Pressurized liquid coolant is distributed to a heat exchanger 812 coupled to a flue gas stack through which flue gas from a power generation device, such as a turbine, flows. Liquid coolant may pass through heat exchanger 812 and absorb heat as it evaporates. Liquid coolant flow control valves 815 may be used to control the superheat of the exiting vapor.

Driver expansion occurs between (1C) and (1D). Gaseous refrigerant on a high-pressure side is maintained at relatively high temperature and pressure, while gaseous refrigerant on a low-pressure side is cooled and depressurized at constant entropy (isentropic). The superheated gaseous refrigerant may be collected in a gas receiver 805 and is used as a motive force to displace a diaphragm in driver cylinder 801. The reciprocating action of the diaphragm is effected by two 3-way solenoid valves 808 that alternately expose the driver diaphragm to hot vapor pressure, such as described with respect to driver cylinder 601 of FIG. 8 above.

Coolant cooling occurs between (1D) and (1A). After exiting driver cylinder 601, the hot gaseous coolant may enter dry cooler 804 to be cooled and condensed to sub-cooled liquid using a relatively little or no water. Gaseous coolant is cooled and condensed at substantially constant pressure. The liquid refrigerant may be discharged into liquid receiver 806 to repeat the refrigeration cycle.

Table 3 below summarizes the coolant properties at state points (1A)-(1D).

| | | Coolant Properties | | |
|---|---|---|---|---|
| State Point | T (° C.) | P (MPa) | h (KJ/kg) | v (m³/kg) | QUAL |
| (1A) | 60 | 0.28 | 274 | 0.00079 | 0 |
| (1B) | 60 | 1.7 | 274 | 0.00078 | 0 |
| (1C) | 143 | 1.7 | 485 | 0.0086 | 1 |
| (1D) | 91 | 0.28 | 455 | 0.06 | 1 |

Figure 11B:
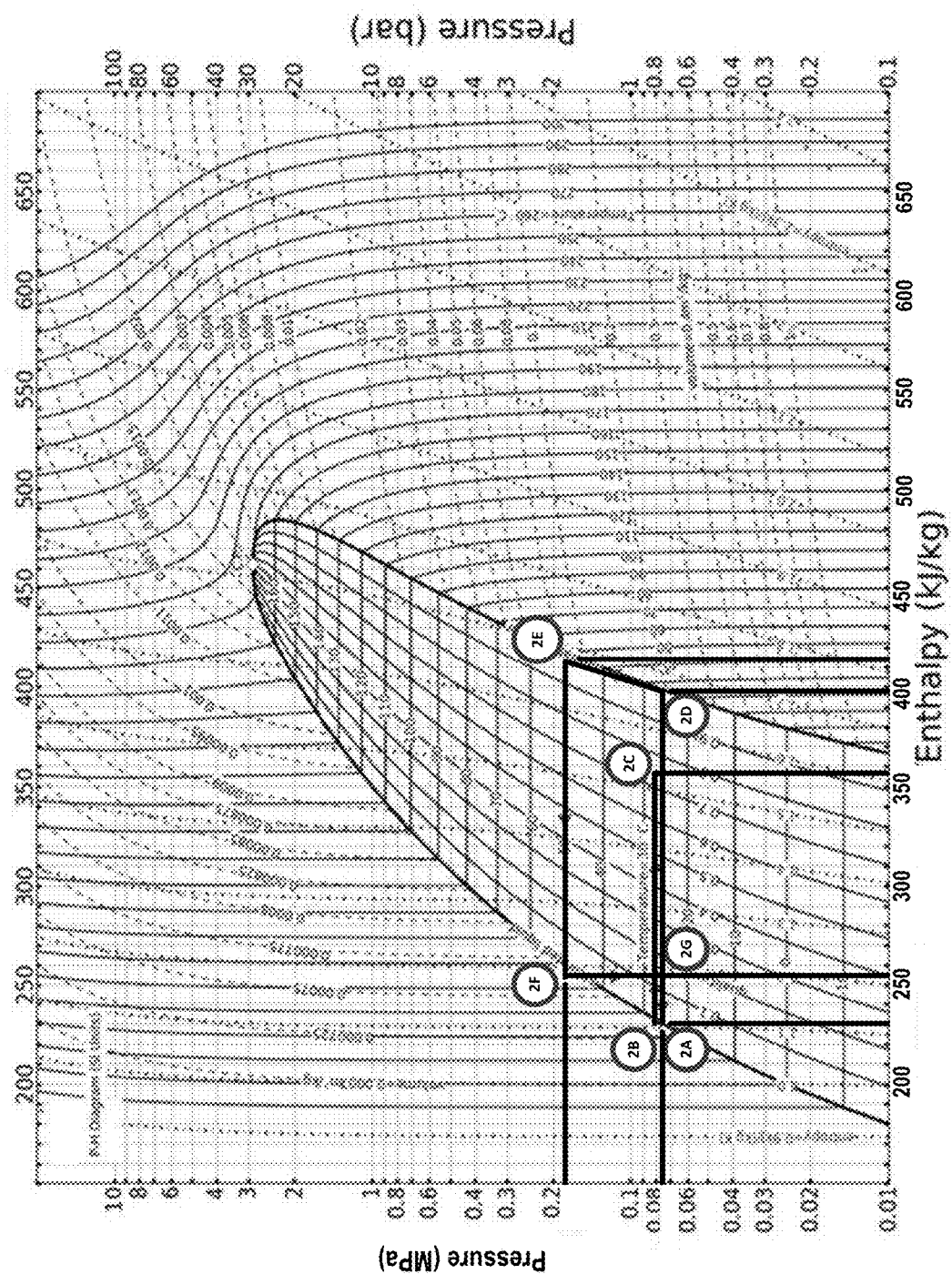
FIG. 11B is an exemplary pressure-enthalpy diagram for a coolant in the second thermodynamic cycle of FIG. 10, in accordance with techniques described herein.

A second thermodynamic cycle is configured to convert work generated by the first thermodynamic cycle into cooling for a third thermodynamic cycle. FIG. 11B is an exemplary pressure-enthalpy diagram for a coolant in the second thermodynamic cycle of FIG. 10, in accordance with techniques described herein.

Subcooled liquid is pumped between (2A) and (2B), which increases a pressure at constant temperature. Subcooled liquid coolant may be accumulated in a liquid receiver 806 and pumped using pump cylinder 802 and pump check valves 814 to increase coolant pressure. Pumping action may be achieved by a reciprocating diaphragm in pump cylinder 802 that is driven by superheated vapor in a driver cylinder 801 at the opposite end of the refrigeration cycle.

Heat extraction occurs between (2B) and (2C). Coolant is heated from a subcooled liquid at constant pressure. A flue gas stream heats the coolant from a subcooled liquid to a superheated gas at constant pressure. Pressurized liquid coolant is distributed to a heat exchanger 812 coupled to a flue gas stack through which flue gas from a power generation device, such as a turbine, flows. Liquid coolant may pass through heat exchanger 812 and absorb heat as it evaporates. Liquid coolant flow control valves 815 may be used to control the superheat of the exiting vapor.

Phase separation occurs between (2C) and (2A/2D). Heated coolant from evaporator 811 enters phase separator 807, along with cooled coolant from expansion device 810, and separates, such as through gravity, into liquid coolant discharged to pump 809 and gaseous coolant discharged to compressor cylinder 803. Coolant from evaporator 811 may be two phase coolant, such that separation by phase separator 807 separates the two phase coolant into single phases.

Compression occurs between (2D) and (2E). Saturated two-phase coolant may be compressed using compressor cylinder 803 and pump check valves 814 to increase coolant pressure. Compression action may be achieved by a reciprocating diaphragm in compressor cylinder 803 that is driven by superheated vapor in driver cylinder 801 in the first thermodynamic cycle.

Refrigerant cooling occurs between (2E) and (2F). Gaseous refrigerant is cooled and condensed at substantially constant pressure. After exiting compressor cylinder 803, the pressurized gaseous coolant may be discharged into gas receiver 805 and subsequently enter dry cooler 804 to be cooled and condensed to sub-cooled liquid using relatively little or no water. Gaseous coolant is cooled and condensed at substantially constant pressure.

Coolant expansion occurs between (2F) and (2G). Subcooled liquid coolant is expanded by an expansion device 810 to a lower temperature and pressure at substantially constant enthalpy. The expanded coolant is discharged into phase separator 807.

Phase separation occurs between (2G) and (2A)/(2D). Cooled, expanded coolant from expansion device 810 enters phase separator 807, along with heated coolant from evaporator 811, and separates, such as through gravity, into liquid coolant discharged to pump 809 and gaseous coolant discharged to compressor cylinder 803.

Table 4 below summarizes the coolant properties at state points (2A)-(2G).

TABLE 4

| | | Coolant Properties | | |
|---|---|---|---|---|
| State Point | T (° C.) | P (MPa) | h (KJ/kg) | v (m³/kg) | QUAL |
| (2A) | 25 | 0.075 | 230 | 0.00073 | 0 |
| (2B) | 25 | 0.08 | 230 | 0.00073 | 0 |
| (2C) | 27 | 0.08 | 357 | 0.14 | 0.75 |
| (2D) | 25 | 0.075 | 398 | 0.19 | 1 |
| (2E) | 50 | 0.18 | 413 | 0.085 | 1 |
| (2F) | 45 | 0.18 | 254 | 0.000765 | 0 |
| (2G) | 25 | 0.075 | 254 | 0.03 | 0.15 |

Figure 11C:
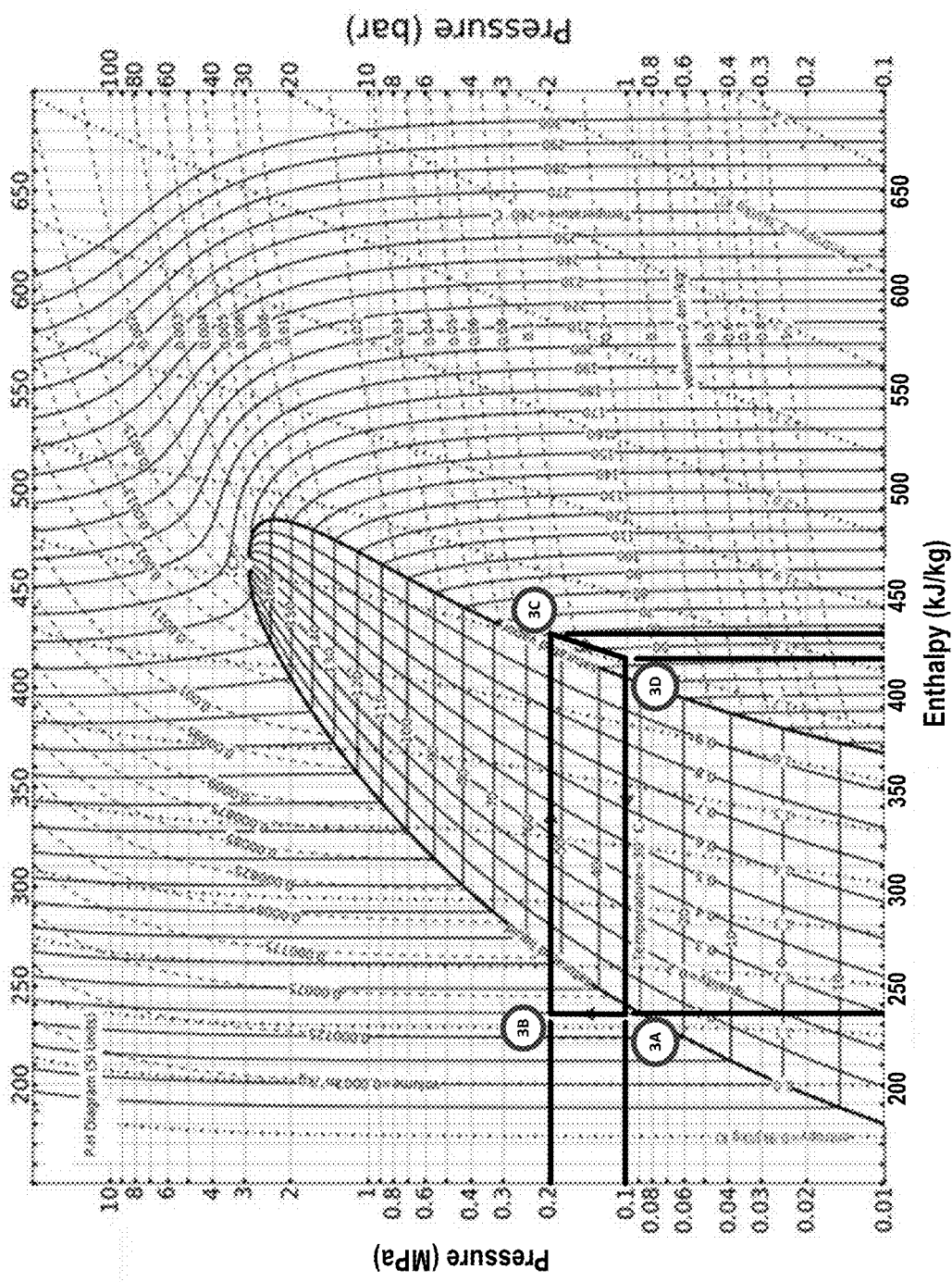
FIG. 11C is an exemplary pressure-enthalpy diagram for a coolant in the third thermodynamic cycle of FIG. 10, in accordance with techniques described herein.

A third thermodynamic cycle is configured to cool one or more CPUs. FIG. 11C is an exemplary pressure-enthalpy diagram for a coolant in the third thermodynamic cycle of FIG. 10, in accordance with techniques described herein. While details of the third thermodynamic cycle are not shown, the third thermodynamic cycle may be operably similar to FIG. 6, unless otherwise indicated.

Subcooled liquid coolant is pumped between state points (3A) and (3B), which increases a pressure of the liquid coolant at constant temperature. Subcooled liquid coolant may be pumped using a pump 820 or pump cylinder (e.g., pump cylinder 602 of FIG. 6) and pump check valves (e.g., pump check valves 618 of FIG. 6) to increase coolant pressure. In some examples, pumping action may be achieved by a reciprocating diaphragm in the pump cylinder that is driven by superheated vapor in a driver cylinder (e.g., driver cylinder 601 of FIG. 6) at the opposite end of the refrigeration cycle.

CPU cooling occurs between state points (3B) and (3C). Pressurized liquid refrigerant is distributed to a heat exchanger 821, such as a microchannel heat exchanger (e.g., microchannel heat exchanger 604 of FIG. 6) coupled to a heater pad (e.g., heater pad 603 of FIG. 6). Liquid coolant may pass through heat exchanger 821 and absorb heat as it evaporates.

Driver expansion occurs between (3C) and (3D). An expansion device 822, such as an expansion valve or a driver (e.g., 3-way valves of driver cylinder 601 of FIG. 6). In the example of a driver, gaseous coolant on a high-pressure side is maintained at relatively high temperature and pressure, while gaseous coolant on a low-pressure side is cooled and depressurized at constant entropy (isentropic). The superheated gaseous coolant is used as the motive force to displace a diaphragm in the driver cylinder. The reciprocating action of the diaphragm is effected by two 3-way solenoid valves (e.g., 3-way solenoid valves 608 of FIG. 6) that alternately expose the driver diaphragm to hot vapor pressure. In other examples, an expansion valve may expand the coolant.

Coolant cooling occurs between (3D) and (3A). After exiting the driver cylinder, the hot gaseous coolant may enter evaporator 811 to be cooled and condensed to sub-cooled liquid by coolant in the second thermodynamic cycle. Gaseous coolant is cooled and condensed at substantially constant pressure to repeat the refrigeration cycle.

Table 5 below summarizes the coolant properties at state points (3A)-(3D).

TABLE 5

Coolant Properties

| State Point | T (° C.) | P (MPa) | h (KJ/kg) | v (m³/kg) | QUAL |
|---|---|---|---|---|---|
| (3A) | 30 | 0.1 | 236 | 0.00074 | 0 |
| (3B) | 30 | 0.2 | 236 | 0.00074 | 0 |
| (3C) | 60 | 0.2 | 427 | 0.08 | 1 |
| (3D) | 43 | 0.1 | 414 | 0.16 | 1 |

What is claimed is:

1. An apparatus, comprising:
a driver comprising a first driver chamber and a second driver chamber separated by a moveable driver barrier coupled to a mechanical link, wherein the driver is configured to:
alternately expand and contract the first and second driver chambers in response to an alternating pressure differential of a gaseous first coolant between a first pressure and a second pressure of the first and second driver chambers, respectively; and
produce a mechanical force from the alternating pressure differential;
a pump mechanically coupled to the driver, wherein the pump is configured to pump a liquid first coolant in response to the mechanical force from the driver; and
a compressor mechanically coupled to the driver, wherein the compressor is configured to compress a second coolant in response to the mechanical force produced by the driver.

2. The apparatus of claim 1,
wherein the pump includes a first pump chamber and a second pump chamber separated by a moveable pump barrier coupled to the mechanical link and configured to alternately expand and contract the first and second pump chambers in response to the mechanical force, and
wherein the compressor includes a first compressor chamber and a second compressor chamber separated by a moveable compressor barrier coupled to the mechanical link and configured to alternately expand and contract the first and second compressor chambers in response to the mechanical force.

3. The apparatus of claim 2, wherein a surface area of the moveable pump barrier is different than a surface area of the moveable compressor barrier.

4. The apparatus of claim 1,
wherein the driver is configured to receive the gaseous first coolant at the first pressure and discharge the gaseous first coolant at the second pressure,
wherein the pump is configured to receive the liquid first coolant at a third pressure and discharge the liquid first coolant at a fourth pressure, and
wherein the compressor is configured to receive the second coolant at a fifth pressure and discharge the second coolant at a sixth pressure.

5. The apparatus of claim 2,
wherein the driver further comprises a 3-way inlet valve and a 3-way outlet valve each fluidically coupled to each of the first and second driver chambers, and
wherein the driver is configured to create the alternating pressure differential across the moveable driver barrier by alternately supplying the gaseous first coolant at the first pressure to one of the first and second driver chambers using the 3-way inlet valve and discharging the gaseous first coolant at the second pressure from the other of the first and second driver chambers using the 3-way outlet valve.

6. The apparatus of claim 5, further comprising a controller communicatively coupled to the driver, wherein the controller includes switch circuitry configured to energize or deenergize the 3-way inlet valve and the 3-way outlet valve based on a position of the moveable driver barrier in the driver.

7. The apparatus of claim 6,
wherein the switch circuitry comprises a first switch adjacent the first driver chamber and a second switch adjacent one of the second driver chamber or the second pump chamber,
wherein the first switch is configured to close when the moveable driver barrier is positioned near the first switch and energize the 3-way inlet valve and the 3-way outlet valve,
wherein the second switch is configured to close when the moveable driver barrier or the moveable pump barrier is positioned near the second switch and deenergize the 3-way inlet valve and the 3-way outlet valve,
wherein the 3-way inlet valve is configured to supply the gaseous first coolant to the first driver chamber in response to being energized and the second driver chamber in response to being deenergized, and
wherein the 3-way outlet valve is configured to discharge the gaseous first coolant from the second driver chamber in response to being energized and the first driver chamber in response to being deenergized.

8. A system, comprising:
a pumping apparatus, comprising:
a driver comprising a first driver chamber and a second driver chamber separated by a moveable driver barrier coupled to a mechanical link, wherein the driver is configured to:
alternately expand and contract the first and second driver chambers in response to an alternating pressure differential of a gaseous first coolant between a first pressure and a second pressure of the first and second driver chambers, respectively; and
produce a mechanical force from the alternating pressure differential;
a pump mechanically coupled to the driver, wherein the pump is configured to pump a liquid first coolant in response to the mechanical force from the driver; and a compressor mechanically coupled to the driver, wherein the compressor is configured to pressurize a second coolant in response to the mechanical force from the driver;
a first thermodynamic cycle driven by the pump, wherein the first thermodynamic cycle is configured to remove heat from a first fluid stream using the first coolant; and
a second thermodynamic cycle driven by the compressor, wherein the second thermodynamic cycle is configured to remove heat from a second fluid stream using the second coolant.

9. The system of claim 8, wherein the first fluid stream comprises a hot gas stream from a waste heat generating system.

10. The system of claim 8,
wherein the first thermodynamic cycle comprises:
a first condenser configured to condense the first coolant; and
one or more heat exchangers configured to remove heat from the first fluid stream using the first coolant; and
wherein the second thermodynamic cycle comprises:
a second condenser configured to condense the second coolant; and
an evaporator configured to remove heat from the second fluid stream using the second coolant.

11. The system of claim 10, wherein at least one of the first condenser and the second condenser comprises at least one of a dry chiller, a dry cooler, a condensing system, or a wet tower.

12. The system of claim 10, wherein each of the first condenser and the second condenser comprises at least one of a dry chiller, a dry cooler, a condensing system, or a wet tower.

13. The system of claim 10, wherein the evaporator comprises a flooded evaporator for the second fluid stream.

14. The system of claim 13, wherein the second thermodynamic cycle comprises:
a phase separator configured to separate gaseous and liquid second coolant;
a first thermodynamic subloop configured to circulate the second coolant from the phase separator to the second condenser using the compressor; and
a second thermodynamic subloop configured to circulate the second coolant from the phase separator to the evaporator.

15. The system of claim 10, wherein the second fluid stream comprises a third cooling loop configured to remove heat from one or more heat sources using a third coolant.

16. The system of claim 15, further comprising the third cooling loop fluidically coupled to the evaporator, wherein the third cooling loop comprises:

one or more heat exchangers configured to remove heat from the heat source using the third coolant; and
a second pumping apparatus configured to pump the third coolant from the evaporator to the one or more heat exchangers.

17. The system of claim 16, wherein the one or more heat exchangers comprise one or more microchannel heat exchangers configured to remove heat generated by at least one computer processor executing within a data center.

18. The system of claim 16, wherein the second pumping apparatus comprises:
a second driver comprising a third driver chamber and a fourth driver chamber separated by a second moveable driver barrier coupled to a second mechanical link, wherein the second driver is configured to:
alternately expand and contract the third and fourth driver chambers in response to an alternating pressure differential of a gaseous third coolant between a third pressure and a fourth pressure of the third and fourth driver chambers; and
produce a mechanical force from the alternating pressure differential;
a fourth pump mechanically coupled to the second driver, wherein the fourth pump is configured to pump a liquid third coolant in response to the mechanical force from the second driver.

19. The system of claim 8, wherein the first coolant and the second coolant have a global warming potential less than 5.

20. A method, comprising:
producing, by a driver of a pumping apparatus, an alternating mechanical force from an alternating pressure differential of a gaseous first coolant, wherein the driver comprises a first driver chamber and a second driver chamber separated by a moveable driver barrier coupled to a mechanical link, and wherein the first and second driver chambers alternately expand and contract in response to the alternating pressure differential of the gaseous first coolant between the first and second driver chambers;
pumping, by a pump of the pumping apparatus and in response to the alternating mechanical force from the driver, a liquid first coolant in a first thermodynamic cycle to remove heat from a first fluid stream; and
compressing, by a compressor of the pumping apparatus and in response to the alternating mechanical force from the driver, a second coolant in a second thermodynamic cycle to remove heat from a second fluid stream.

* * * * *